US012775056B2

(12) United States Patent
Thevathasan et al.

(10) Patent No.: US 12,775,056 B2
(45) Date of Patent: Oct. 27, 2026

(54) HEAD COIL SYSTEM AND METHODS

(71) Applicant: SYNAPTIVE MEDICAL INC., Toronto (CA)

(72) Inventors: Gilbert Thevathasan, Brampton (CA); William Wai-Leung Lau, Toronto (CA); Alex Gyles Panther, Toronto (CA)

(73) Assignee: SYNAPTIVE MEDICAL INC., Mississauga (CA)

( * ) Notice: Subject to any disclaimer, the term of this patent is extended or adjusted under 35 U.S.C. 154(b) by 487 days.

(21) Appl. No.: 18/465,412

(22) Filed: Sep. 12, 2023

(65) Prior Publication Data

US 2025/0085367 A1 Mar. 13, 2025

Related U.S. Application Data

(60) Provisional application No. 63/405,594, filed on Sep. 12, 2022.

(51) Int. Cl.
*G01R 33/34* (2006.01)
*G01R 33/28* (2006.01)
*G01R 33/38* (2006.01)

(52) U.S. Cl.
CPC ..... *G01R 33/34046* (2013.01); *G01R 33/283* (2013.01); *G01R 33/3802* (2013.01)

(58) Field of Classification Search
None
See application file for complete search history.

(56) References Cited

U.S. PATENT DOCUMENTS

| | | | | |
|---|---|---|---|---|
| 6,577,888 | B1 * | 6/2003 | Chan | G01R 33/3415 324/318 |
| 7,345,483 | B2 * | 3/2008 | Vaughan | G01R 33/34046 324/318 |
| 8,638,100 | B2 * | 1/2014 | Driemel | G01R 33/34007 324/318 |
| 9,250,302 | B2 * | 2/2016 | Driemel | G01R 33/28 |
| 10,379,178 | B2 * | 8/2019 | Driemel | G01R 33/34007 |
| 10,827,948 | B1 * | 11/2020 | Tramm | A61B 5/7405 |
| 11,435,418 | B2 * | 9/2022 | Lau | G01R 33/34084 |
| 11,500,046 | B2 * | 11/2022 | Tenley | G01R 33/34007 |
| 2013/0023756 | A1 * | 1/2013 | Driemel | G01R 33/28 600/422 |
| 2013/0076358 | A1 * | 3/2013 | Taracila | G01R 33/34084 324/322 |
| 2013/0131498 | A1 | 5/2013 | Chan et al. | |
| 2015/0057527 | A1 | 2/2015 | Driemel | |

(Continued)

*Primary Examiner* — Bernard Rojas

(57) ABSTRACT

Head coil systems and methods involving a plurality of portions, each portion of the plurality of portions having a magnetically conductive receiver coil and a frame configured to accommodate the magnetically conductive receiver coil, and each portion of the plurality of portions configured to couple and decouple with another portion of the plurality of portions; at least one coupling feature configured to at least one of couple, lock, unlock, and decouple at least one portion of the plurality of portions in relation to another at least one portion of the plurality of portions, the at least one coupling feature having a forward coupling feature and an aft coupling feature; and a tilting feature configured to dispose at least one portion of the plurality of portions at an angle in relation to a horizontal plane.

18 Claims, 23 Drawing Sheets

(56) References Cited

U.S. PATENT DOCUMENTS

| | | | | |
|---|---|---|---|---|
| 2015/0057528 | A1 | 2/2015 | Driemel | |
| 2018/0356477 | A1* | 12/2018 | Lau | G01R 33/34084 |
| 2022/0291309 | A1* | 9/2022 | Hou | G01R 33/30 |

* cited by examiner

HEAD COIL SYSTEM AND METHODS

CROSS REFERENCE TO RELATED APPLICATION(S)

The document is a Nonprovisional patent application claiming the benefit of, and priority to, U.S. Provisional Patent Application Ser. No. U.S. 63/405,594, entitled "SYSTEM AND METHOD FOR A TWO-PART CLAMSHELL SHAPE RECEIVE HEAD COIL SYSTEM," filed on Sep. 12, 2022, all of which are hereby incorporated by reference in their entirety.

FIELD

The present disclosure relates to the field of magnetic resonance imaging (MRI) systems and methods. More particularly, the present disclosure relates to the field of radio-frequency (RF) coil systems and methods for MRI. Even more particularly, the present disclosure relates to the field of RF head coil systems and methods for MRI.

BACKGROUND

In the related art, RF coils are the receivers, and sometimes also the transmitters, of RF signals in the field of MRI. The magnetic resonance (MR) signal in MRI is generated by way of resonance emitted by RF coils which typically involve two types of electromagnetic coils, transmitter coils and receiver coils, respectively generating and receiving signals corresponding to electromagnetic (EM) fields. Atomic nuclei have distinctive resonant frequencies in the RF portion of the EM spectrum for use in MRI.

Referring to FIG. 1, this diagram illustrates an MRI "head coil" or an MRI "brain coil" 10 that typically has a birdcage configuration, in accordance with the related art. These related art head coils are cumbersome and cause various types of physical and emotional distress in a subject, such as a patient, including claustrophobia. Referring physicians, radiologists, and MRI technologists currently attempt to manage affected patients by understanding the etiology of the problem and attempting an appropriate maneuver or an appropriate intervention to counter-act the condition. However, any such efforts are limited by the physical constraints of related art MRI equipment. Since many of the birdcage-style head coils are rigid and fabricated to fit a regularly shaped median-size head, subjects whose head is either larger or irregularly shaped may suffer physical distress by the ill-fitting related art head coil.

In related art MRI equipment, "psychological distress," experienced by a subject in the MR environment, includes all subjectively unpleasant experiences attributable to a procedure. For instance, a patient may experience distress that ranges from mild anxiety to a serious panic attack, whereby psychiatric intervention or medication is necessitated. Severe psychological reactions to MR examinations are characterized by the rapid onset of at least four of the following symptoms: nausea, paresthesias, palpitations, chest pain, faintness, dyspnea, choking sensation, sweating, trembling, vertigo, depersonalization, fear of losing control, or fear of dying.

Specifically, an ill-fitting related art head coil may cause claustrophobia in many patients who are predisposed to anxiety disorders, wherein claustrophobia is characterized by the marked, persistent, and excessive fear of enclosed spaces. In such affected individuals, being in an enclosed space, e.g., as in an MRI machine, especially in a related art MRI head coil, tends to provoke an immediate anxiety response, rising to the level of a panic attack. Considerable time is expended by medical personnel in attempting to ameliorate such distress, usually resulting in compromising the MR imaging.

Accordingly, MRI head coils have experienced many challenges in the related art, such as adequate accommodation of a patient head in terms of both volume and shape, limited maneuverability, limited to non-existent adjustability, and a requirement that a patient's head is disposed into related art coils, and the requirement that, if a patient is already lying down, the patient must rise to place the related art underneath the patient's head in order to dispose the patient's head therein, thereby adversely affecting patient comfort as well as MR image quality.

SUMMARY

The present disclosure involves a system and methods for a two-part clam-shell shaped head receive coil for a magnetic resonance imaging device. The two-part clam-shell housing having at least an upper portion and a lower portion with an anterior coil and posterior coil integrated therebetween. A further tilt wedge can be positioned under the lower portion that can angle the coil up to 10° from the horizontal and locks to the bed and posterior coil.

In an embodiment of the present disclosure, a head coil system comprises: a plurality of portions, each portion of the plurality of portions comprising a magnetically conductive receiver coil and a frame configured to accommodate the magnetically conductive receiver coil, and each portion of the plurality of portions configured to couple and decouple with another portion of the plurality of portions; at least one coupling feature configured to at least one of couple, lock, unlock, and decouple at least one portion of the plurality of portions in relation to another at least one portion of the plurality of portions, the at least one coupling feature comprising a forward coupling feature and an aft coupling feature; and a tilting feature configured to dispose at least one portion of the plurality of portions at an angle in relation to a horizontal plane.

In an embodiment of the present disclosure, a method of fabricating a head coil system comprises: providing a plurality of portions, providing the plurality of portions comprising providing each portion with a magnetically conductive receiver coil and a frame configured to accommodate the magnetically conductive receiver coil, and providing the plurality of portions comprising providing each portion configured to couple and decouple with another portion of the plurality of portions; providing at least one coupling feature configured to at least one of couple, lock, unlock, and decouple at least one portion of the plurality of portions in relation to another at least one portion of the plurality of portions, providing the at least one coupling feature comprising providing a forward coupling feature and providing an aft coupling feature; and providing a tilting feature configured to dispose at least one portion of the plurality of portions at an angle in relation to a horizontal plane In an embodiment of the present disclosure, a method of using a head coil system, comprising: providing a head coil system, providing the head coil system comprising: providing a plurality of portions, providing the plurality of portions comprising providing each portion with a magnetically conductive receiver coil and a frame configured to accommodate the magnetically conductive receiver coil, and providing the plurality of portions comprising providing each portion configured to couple and decouple with another portion of the plurality of portions; providing at least one coupling feature configured to at least one of couple, lock, unlock, and decouple at least one portion of the plurality of portions in relation to another at least one portion of the plurality of portions, providing the at least one coupling feature comprising providing a forward coupling feature and providing an aft coupling feature; and providing a tilting feature configured to dispose at least one portion of the plurality of portions at an angle in relation to a horizontal plane; disposing head coil system in relation to a bed of a medical transporter; and at least one of coupling, locking, unlocking, and decoupling the lower portion in relation to the bed of the medical transporter.

Some of the features in the present disclosure are broadly outlined in order that the section entitled Detailed Description is better understood and that the present contribution to the art may be better appreciated. Additional features of the present disclosure are described hereinafter. In this respect, understood is that the present disclosure is not limited in its application to the details of the components or steps set forth herein or as illustrated in the several figures of the being carried out in various ways. Also, understood is that the phraseology and terminology employed herein are for the purpose of the description and should not be regarded as limiting.

BRIEF DESCRIPTION OF THE DRAWING

The above, and other, aspects, features, and advantages of several embodiments of the present disclosure will be more apparent from the following Detailed Description as presented in conjunction with the following several figures of the Drawing.

Figure 1:
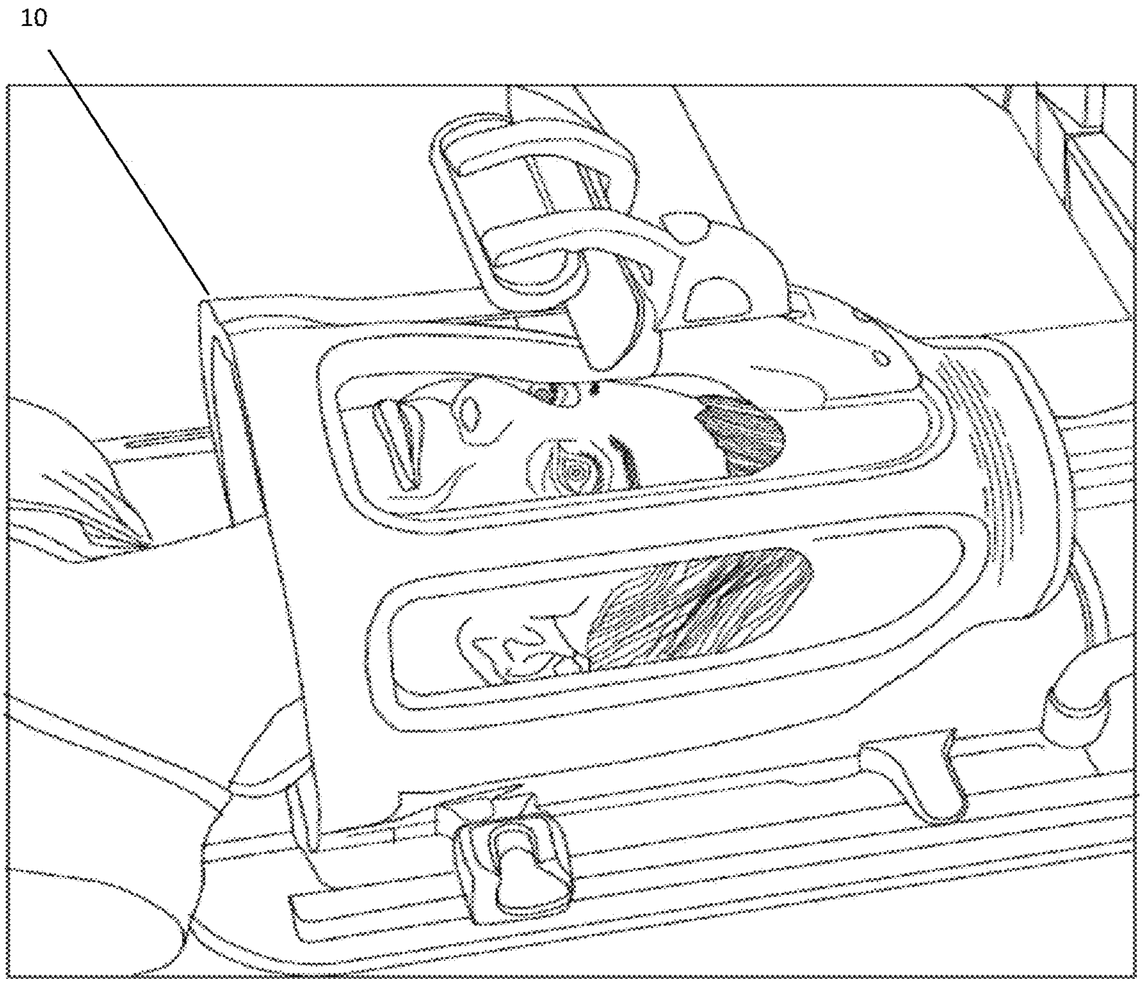
FIG. 1 is a diagram illustrating, in a perspective view, an MRI "head coil" or an MRI "brain coil" having a birdcage configuration, typically stored in a separate cabinet until ready for use, in accordance with the related art.

Corresponding reference numerals or characters indicate corresponding components throughout the several figures of the Drawing. Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood, elements that are useful or necessary in commercially feasible embodiments are often not depicted in order to facilitate a less obstructed view of these various embodiments of the present disclosure.

DETAILED DESCRIPTION

The present disclosure generally involves a head coil system and methods for enhancing and/or optimizing MRI that is readily implementable in relation to newly manufactured MRI machines or readily retrofittable in relation to existing MRI machines. The presently disclosed head coil system and methods for enhancing and/or optimizing MRI may adapt an MRI machine to perform with an increased efficiency and an increased accuracy by at least better accommodating a patient head and by better disposing radio-frequency coils in relation to the patient head.

According to embodiments of the disclosure, the head coil system for a MRI machine has at least the following benefits: improved signal-to-noise ratio (SNR), thereby allowing .scan times that are less than those in the related art, providing better ergonomics and fit for a plurality of patients than related art head coils, providing a tilted orientation to alleviate at least one of kyphosis and neck pain, and providing a fit for an ACR phantom with dimensions of 20.4 cm in diameter by 16.5 cm in length and internal dimensions of 19.0 cm diameter by 15.0 cm in length, thereby improving connector locking.

Figure 2:
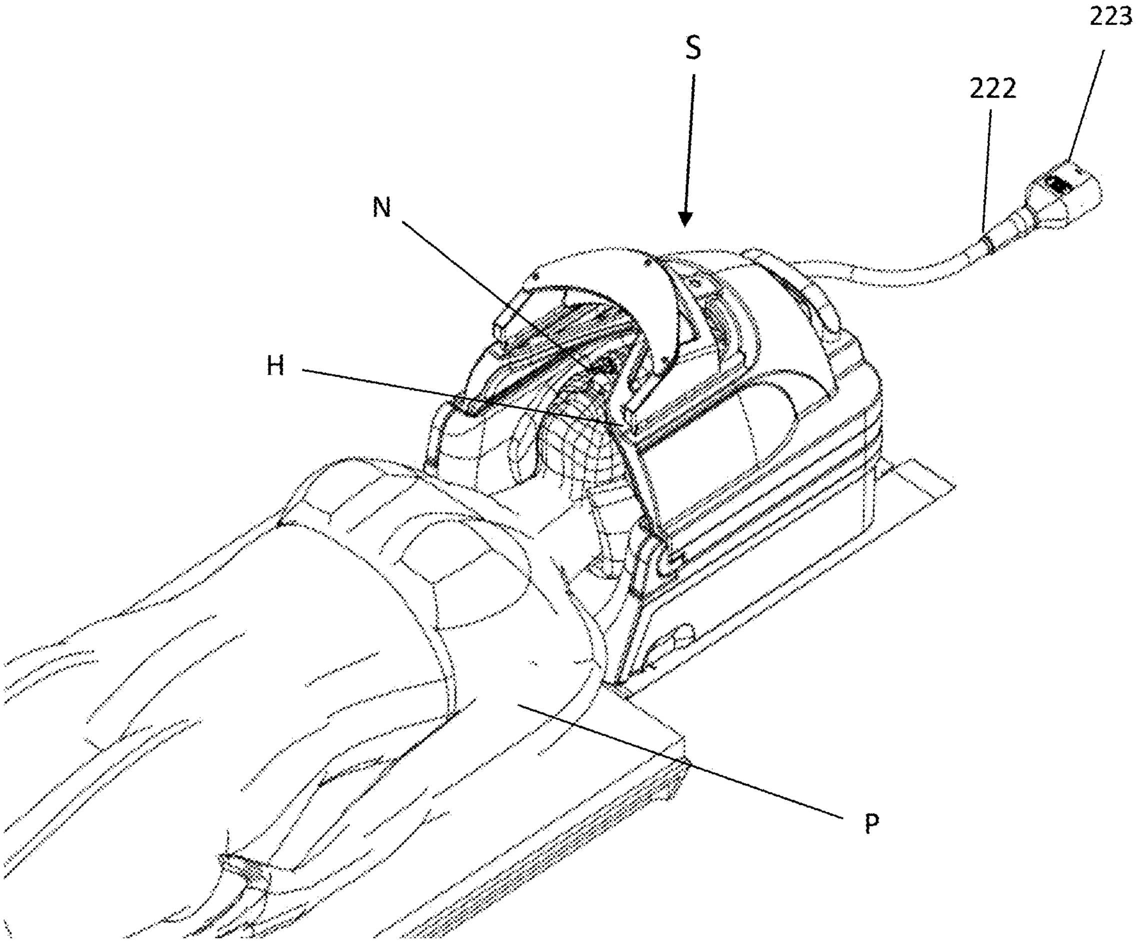
FIG. 2 is a diagram illustrating a perspective view of a head coil system for enhancing and/or optimizing MRI, shown in a closed position, in accordance with an embodiment of the present disclosure.

Referring to FIG. 2, this diagram illustrates a perspective view of ahead coil system S, comprising a plurality of portions, for enhancing and/or optimizing MRI, shown in a closed position, in accordance with an embodiment of the present disclosure. By example only, the head coil system S is configured to accommodate a head H of a patient P and is shown in a closed position. The plurality of portions comprises a two-part configuration, by example only. The two-part configuration comprises a clam-shell configuration, for example. The head coil system S further comprises a configuration which accommodates a nose N of a patient P. For example, a portion of the plurality of portions may be formed in a V-shape to accommodate any nose N.

Figure 3:
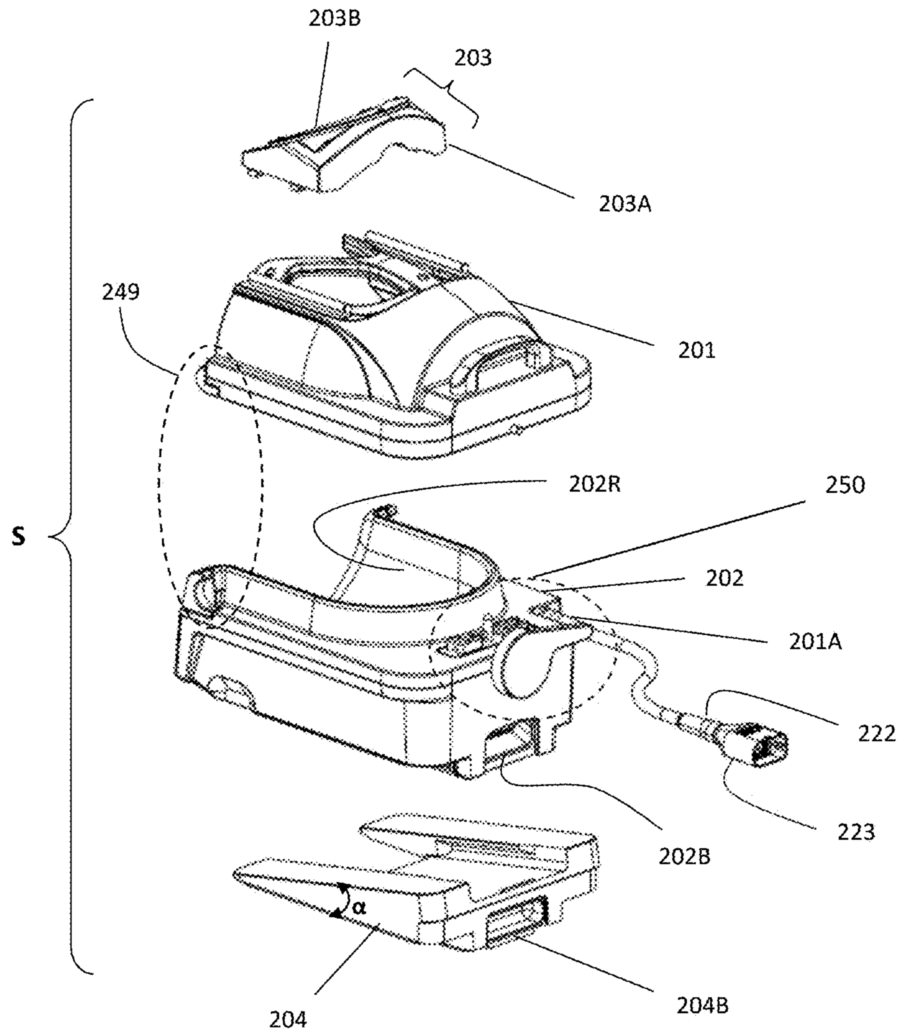
FIG. 3 is a diagram illustrating an exploded view of a head coil system, in accordance with an embodiment of the present disclosure.

Still referring to FIG. 2, the plurality of portions comprises: an upper portion 201, e.g., an anterior coil portion, and lower portion 202, e.g., a posterior coil portion, operably coupled with the upper portion 201 (FIG. 3). The upper portion 201 comprises at least one connector 201*a* configured to couple with the lower portion 202 and at least one cable connector 222 to an (Rx) chain (not shown). The upper portion 201 is reconfigured to be interchangeable in relation to at least one anterior module, e.g., a two-loop anterior module and a horseshoe anterior module. The upper portion 201 comprises at least one mounting feature 201*m* configured to mount a viewing accessory 203, such as a mirror. The lower coil portion 202 comprises at least one surface configured to accommodate the head H of the patient P. The lower portion 202 further comprises at least one locking feature **202*b* configured to couple, lock, and unlock in relation to a bed B, such as by way of a tongue 70** of the bed B, of a medical transporter T, e.g., a patent transporter.

Still referring to FIG. 2, the head coil system S further comprises a tilting feature 204 configured to couple, lock, and unlock the lower portion 202, such as by at least one locking feature **204*b*, with the bed B and to tilt the system S in relation to the bed B in a range of approximately 0 degrees to approximately 10 degrees from a horizontal plane. The tilting feature 204 comprises at least one of a wedge configuration and a trough configuration of the bed B, by examples only. The head coil system S further comprises a viewing accessory 203** configured to facilitate viewing an environment outside of the MRI machine, whereby patient comfort is enhanced. The head coil system S further comprises at least one conductor (not shown), such as at least one a copper (Cu) conductor and at least one Cu tube conductor, by examples only. The at least one conductor is configured to tilt.

Referring to FIG. 3, this diagram is an exploded view of a head coil system S, in accordance with an embodiment of the present disclosure. The head coil system S comprises a plurality of portions, the plurality of portions comprising an upper portion 201 (or "anterior coil") and a lower portion 202 (or "posterior coil") operably coupled with the upper portion 201. The head coil system S further comprises a tilting feature 204 configured to couple, lock, and unlock the lower portion 202 with the bed B and to tilt the plurality of portions, effectively the entire head coil system S in relation to the bed B at angle α in a range of approximately 0 degrees to approximately 10 degrees from a horizontal plane. The tilting feature 204 comprises at least one of a wedge configuration and a trough configuration of the bed B, by examples only. The at least one locking feature **204*b* may operate in the same manner as the locking feature 202*b* for coupling, locking, unlocking, and decoupling the tongue 70** *f* the bed B (FIG. 6).

Figure 4A:
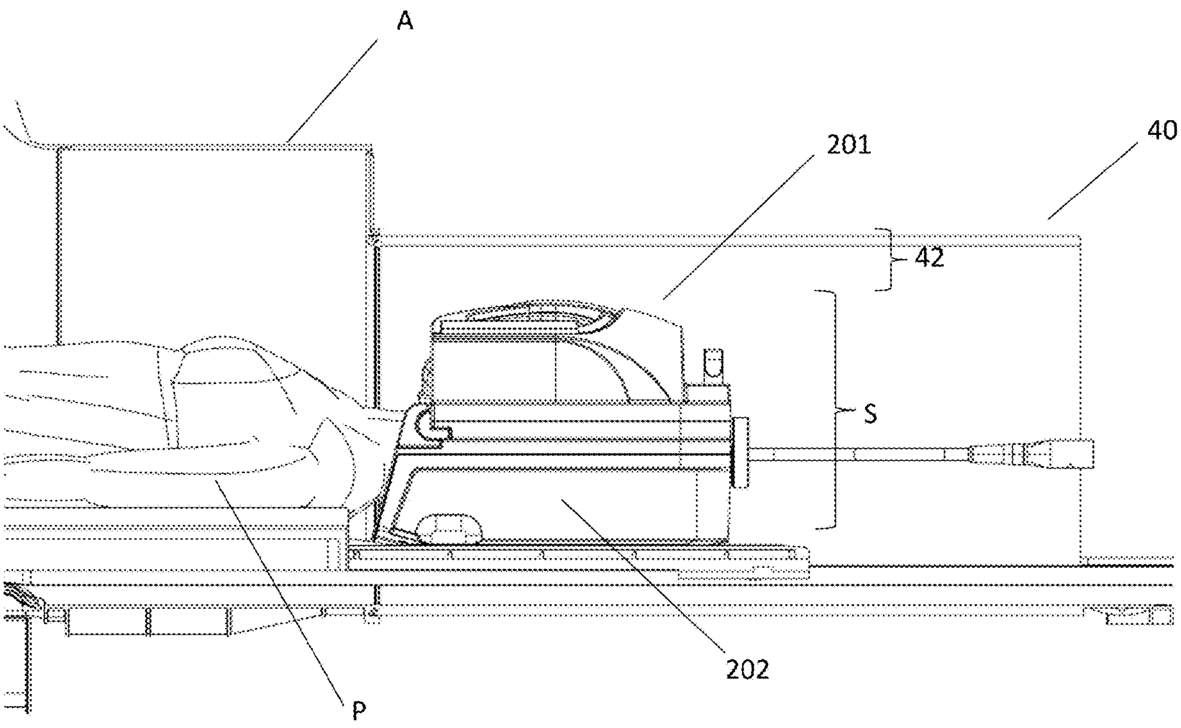
FIG. 4A is a diagram illustrating a cutaway side view of a head coil system in a flat orientation, in accordance with an embodiment of the present disclosure.
Figure 4B:
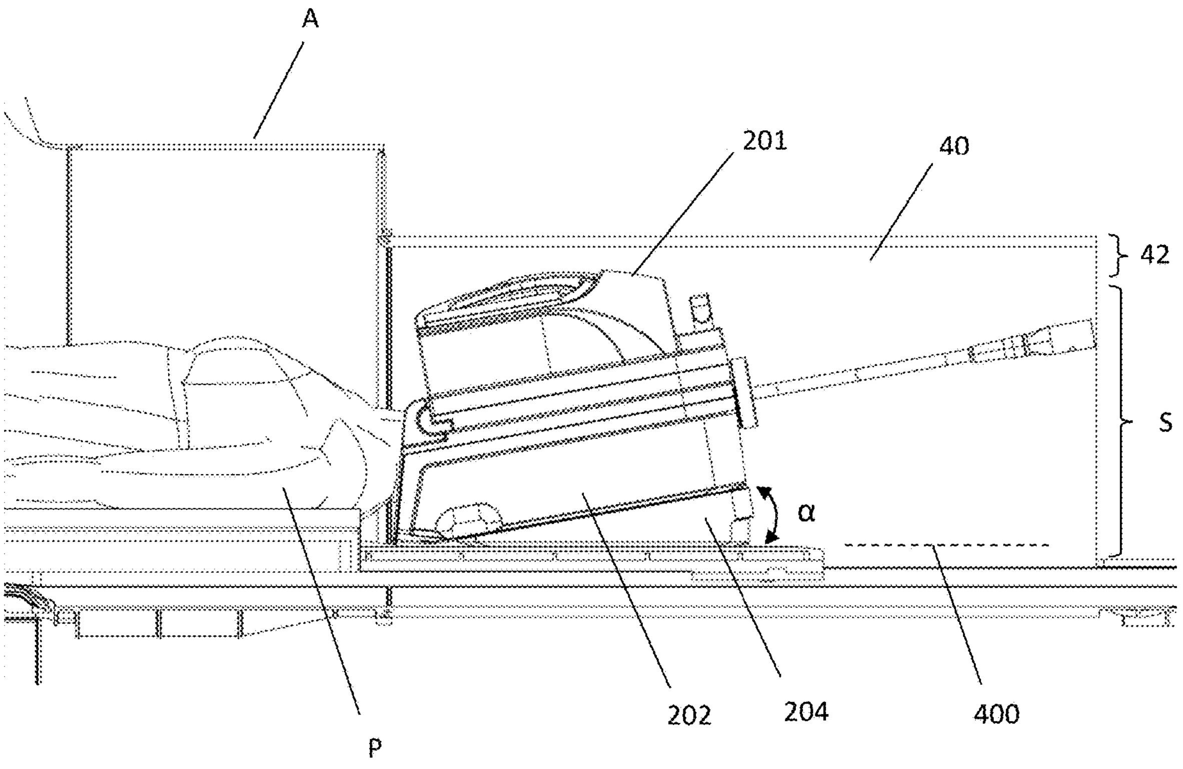
FIG. 4B is a diagram illustrating a cutaway side view of the head coil system, as shown in FIG. 4A, in a tilted orientation, in accordance with an embodiment of the present disclosure.

Still referring to FIG. 3 and referring ahead to FIGS. 4B and 5A-5C, in an embodiment of the present disclosure, a head coil system S comprises: a plurality of portions, e.g., an upper portion 201 and a lower portion 202, each portion of the plurality of portions comprising a magnetically conductive receiver coil, e.g., respectively, an upper coil **201*c* and a lower coil 202*c*, and a frame, e.g., respectively, an upper frame 201*f* and a lower frame 202*f*, configured to accommodate the magnetically conductive receiver coil, e.g., respectively, an upper coil 201*c* and a lower coil 202*c*, and each portion of the plurality of portions, e.g., respectively, the upper portion 201 and the lower portion 202, configured to couple and decouple with another portion of the plurality of portions, e.g., respectively, the lower portion 202 and the upper portion 201; at least one coupling feature, e.g., an forward coupling feature 250 and an aft coupling feature 249, configured to at least one of couple, lock, unlock, and decouple at least one portion of the plurality of portions, e.g., respectively, the upper portion 201 and the lower portion 202, in relation to another at least one portion of the plurality of portions, e.g., respectively, the lower portion 202 and the upper portion 201, the at least one coupling feature comprising a forward coupling feature 250 and an aft coupling feature 249; and a tilting feature 204 configured to dispose at least one portion of the plurality of portions at an angle α in relation to a horizontal plane 400 (FIG. 4**B).

Still referring to FIG. 3, components of the system S, e.g., housing components, comprise at least one of urethane, cast urethane, polyoxymethylene (POM), and polyether ether ketone (PEEK), by examples only. Fasteners of the system S comprise at least one of brass fasteners and polymer fasteners. In the system S, brass fasteners a disposed at a distance in a range of at least approximately 25 mm away from a head H of a patient P. Polymer fasteners are used in locations of the system S where brass fasteners cannot be used in light of MR. The system S is configured to accommodate a head H having a height in a range of approximately 175 mm to approximately 210 mm and a diameter in a range of approximately 137 mm to approximately 163 mm.

Still referring to FIG. 3, the bottom portion 202 comprises a lower frame **202*f* configured to fit between the tilt feature 204 and the upper frame 201*f*, whereby a resting surface 202*r* is provided for the head H of the patient P. The lower frame 202*f* is configured to couple, lock, unlock, and decouple the lower portion 202 in relation to the bed B. The upper portion 201 comprises an upper frame 201*f* configured to couple with the lower frame portion 202*f*. The upper frame 201*f* comprises an upper coil 201*c*. The lower frame 202*f* comprises a lower coil 202*c*. The upper coil 201*c* is configured to couple with the lower coil 202*c* to effect a receiver chain, such as by overlapping the upper coil 201*c* with the lower coil 202*c*. The upper coil 201*c* is interchangeable with at least one other module, such as an upper RF module, a two-loop coil, and a horseshoe coil, by example only. In an alternative embodiment, the system S further comprises a viewing accessory 203 configured to couple with the upper frame 201*f* and to provide viewing of an environment external to the imaging apparatus A. The viewing accessory 203 comprises a viewing accessory, such as a mirror 203*b*, and a mounting feature 203*a* configured to couple the viewing accessory 203 with the upper frame 201*f***, by example only.

Referring to FIG. 4A, this diagram illustrates a cutaway side view of a head coil system S in a flat orientation within a bore 40 of an MRI machine A, in accordance with an embodiment of the present disclosure. The head coil system S, in the flat orientation, improves clearance 42 in the bore 40 and facilitates a plurality of configurations for the viewing accessory 203.

Referring to FIG. 4B, this diagram illustrates a cutaway side view of the head coil system S, as shown in FIG. 4A, in a tilted orientation within the bore 40 of the MRI machine A, in accordance with an embodiment of the present disclosure. The head coil system S effects a "tilted" coil by way of the tilting feature 204, such as comprising a wedge configuration. The tilting feature 204 is configured to couple, lock, and unlock the lower portion 202 with the bed B and to tilt the system S in relation to the bed B in a range of approximately 0 degrees to approximately 10 degrees from a horizontal plane. The head coil system S, even in the tilted orientation, still improves the clearance 41 in the bore 40 and still facilitates a plurality of configurations for the viewing accessory 203.

Figure 4C:
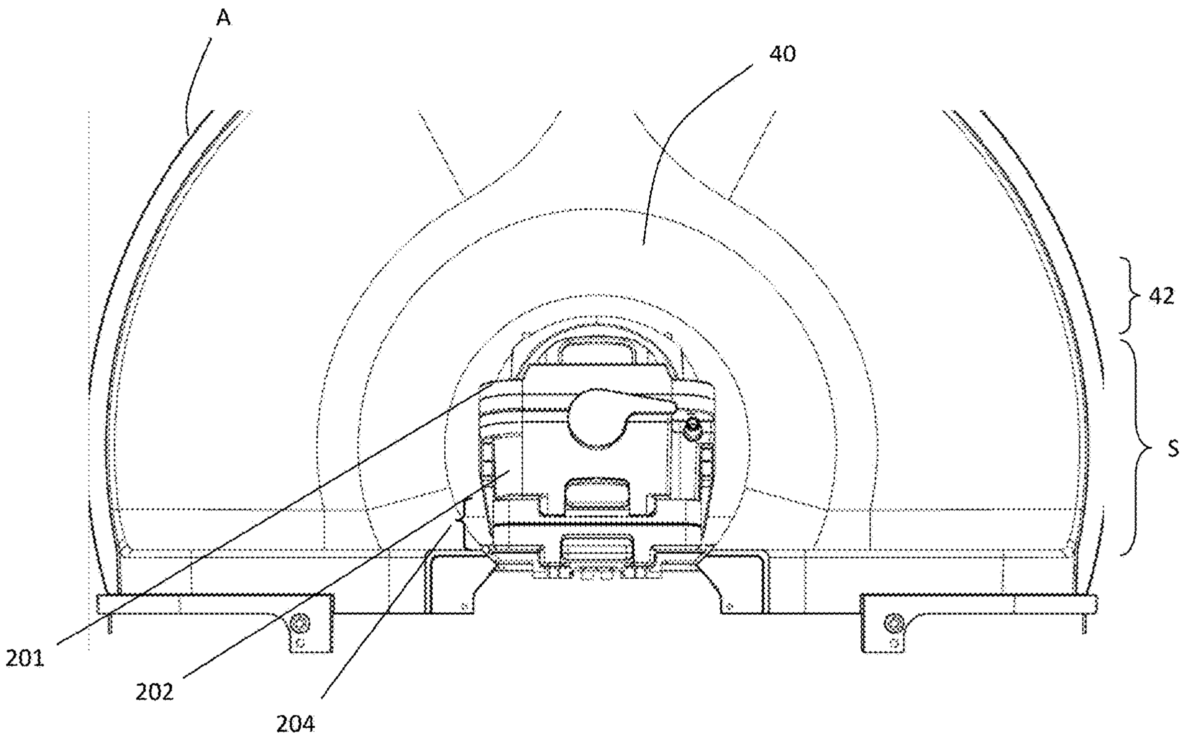
FIG. 4C is a diagram illustrating a cutaway rear view of the head coil system, as shown in FIGS. 4A and 4B, in a tilted orientation, in accordance with an embodiment of the present disclosure.

Referring to FIG. 4C, this diagram illustrates a cutaway rear view of the head coil system S, as shown in FIGS. 4A and 4B, in a tilted orientation within the bore 40 of the MRI machine A, in accordance with an embodiment of the present disclosure. The head coil system S, even in the tilted orientation, still improves the clearance 41 in the bore 40 and still facilitates a plurality of configurations for the viewing accessory 203.

Figure 5A:
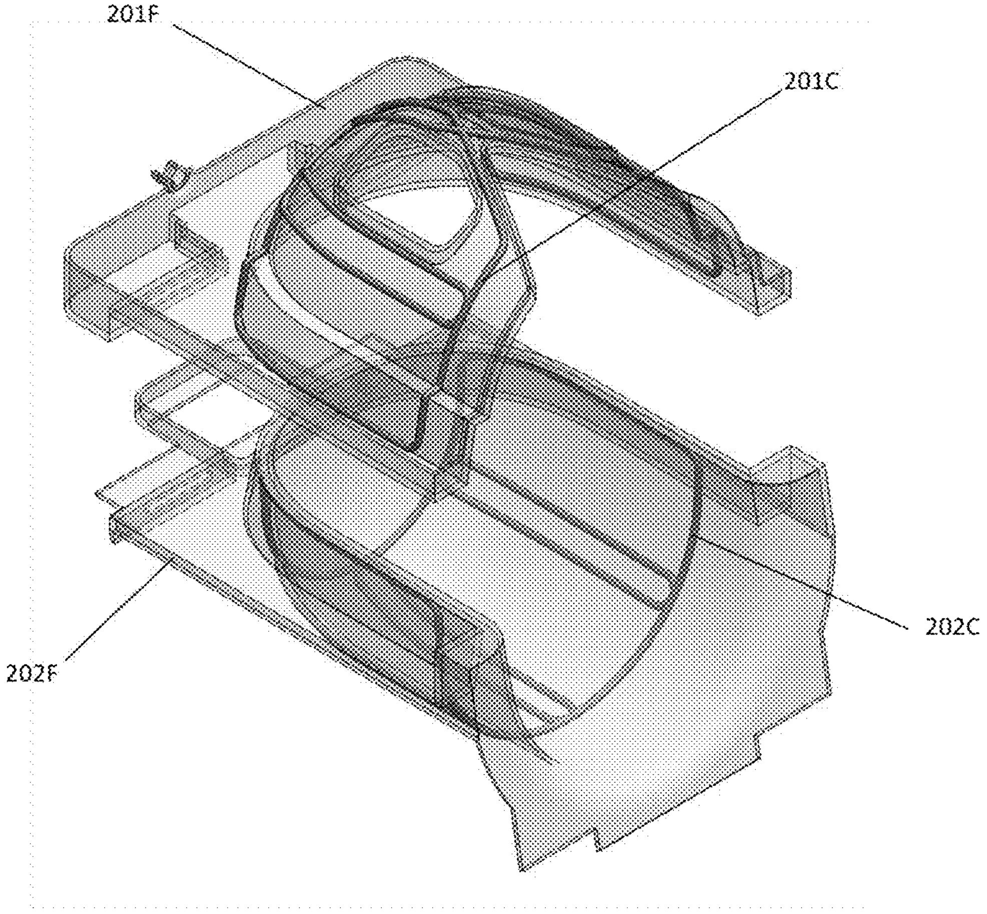
FIG. 5A is a diagram illustrating an exploded perspective view of a plurality of receiver coils disposed within a plurality of frame portions, in accordance with an embodiment of the present disclosure.

Referring to FIG. 5A, this diagram illustrates an exploded perspective view of a plurality of receiver coils disposed within a plurality of frame portions of a head coil system S, in accordance with an embodiment of the present disclosure. By example only, the plurality of receiver coils comprises an upper coil 201*c* and a lower coil 202*c*; and the plurality of frame portions comprises an upper frame 201*f* and a lower frame 202*f*. The upper coil 201*c* is supported by the upper frame 201*f*; and the lower coil 202*c* is supported by the lower frame 202*f*.

Figure 5B:
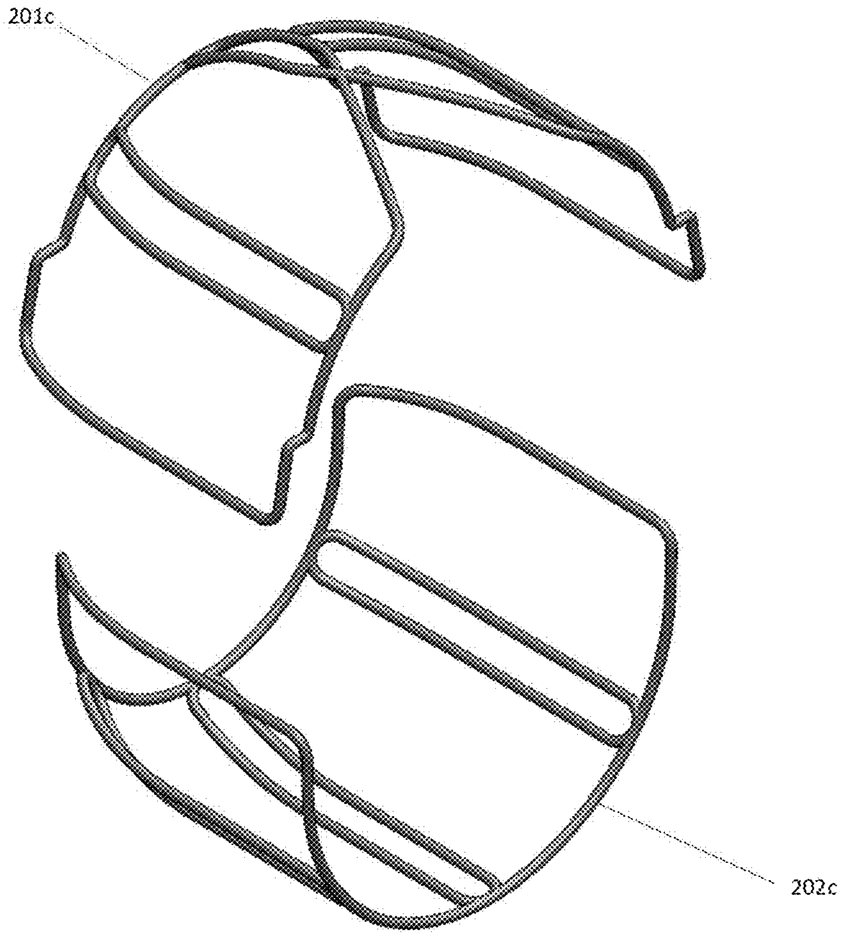
FIG. 5B is a diagram illustrating an exploded perspective view of the plurality of receiver coils of the head coil system, as shown in FIG. 6A, in accordance with an embodiment of the present disclosure.

Referring to FIG. 5B, this diagram illustrates an exploded perspective view of the plurality of receiver coils of the head coil system S, as shown in FIG. 5A, in accordance with an embodiment of the present disclosure. By example only, the plurality of receiver coils comprises an upper coil 201*c* and a lower coil 202*c*. Each of the upper coil 201*c* and the lower coil 202*c* comprises a loop pattern. When the system S is disposed in an "open" position, the upper coil 201*c* is spaced apart from the lower coil 202*c*.

Figure 5C:
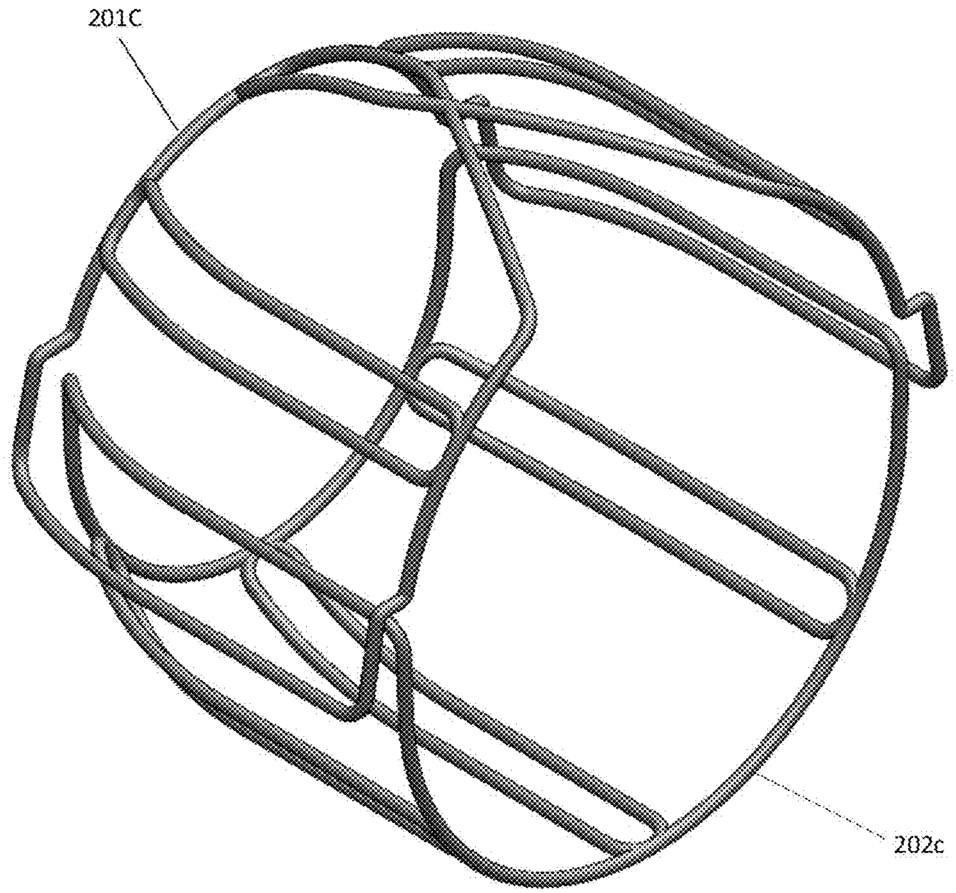
FIG. 5C is a diagram illustrating a perspective of the plurality of receiver coils of the head coil system, as shown in FIGS. 5A and 5B, in an overlapping disposition, in accordance with an embodiment of the present disclosure.

Referring to FIG. 5C, this diagram illustrates a perspective view of the plurality of receiver coils of the head coil system S, as shown in FIGS. 5A and 5B, in accordance with an embodiment of the present disclosure. By example only, the plurality of receiver coils comprises an upper coil 201*c* and a lower coil 202*c*. Each of the upper coil 201*c* and the lower coil 202*c* comprises a loop pattern. When the system S is disposed in an "closed" position, the upper coil 201*c* overlaps and operably couples with the lower coil 202*c*. The plurality of receiver coils comprises at least one of copper and other magnetically conductive material.

Figure 6A:
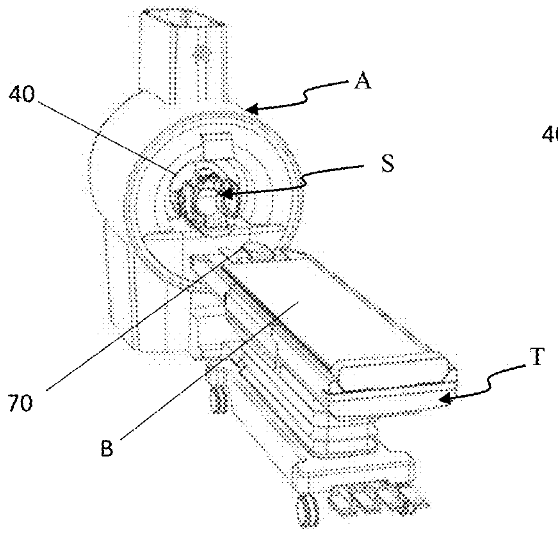
FIG. 6A is a diagram illustrating a perspective view of a head coil system in an undeployed disposition, for use with an MRI machine, in accordance with an embodiment of the present disclosure.

Referring to FIG. 6A, this diagram illustrates a perspective view of a head coil system S in an undeployed disposition for use with an MRI machine A, in accordance with an embodiment of the present disclosure. The system S is ready to engage with a bed B of a medical transporter T. The head coil system S is optionally adjustable and comprises a plurality of portions, such as an upper portion 201 and lower portion 202 having a locking feature 202*b* (FIG. 3). The system S further comprises a tilting feature 204 having a locking feature 204*b* (FIG. 3). Both the locking feature 202*b* and the locking feature 204*b* are configured to couple, lock, unlock, and decouple a tongue portion 70 of the bed B. In an undeployed state, the system S is storable in relation to the bore 40 of the MRI machine A. The system S is operably coupled with the MRI machine A by way of a guide-and-rail system (not shown) disposed in the bore 40. and wherein the tongue portion 14 is disengaged from the lower portion 11 and the opposing side portions 13, such as when the system S is not in use, in accordance with an embodiment of the present disclosure.

Still referring to FIG. 6A, by using the head coil system S, a patient P would be disposed on the bed B of the medical transporter T, wherein the patient's head H is comfortably disposed on the tongue 70, awaiting engagement with the system S. The transporter T is easily movable toward the MRI machine A, whereby the tongue 70 would readily engage and/or registers with either the lower portion 202 or the tilting feature 204, e.g., by way a guide-and-rail system.

Figure 6B:
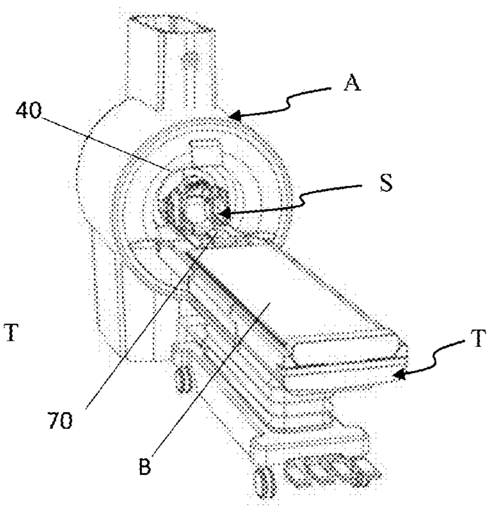
FIG. 6B is a diagram illustrating a perspective view of the head coil system, as shown in FIG. 6A, being deployed for use with the MRI machine, in accordance with an embodiment of the present disclosure.

Referring to FIG. 6B, this diagram illustrates a perspective view of a head coil system S, as shown in FIG. 6A, being deployed for use with the MRI machine A, in accordance with an embodiment of the present disclosure. The system S is engaged with the bed B of a medical transporter T. In a deploying state, the system S is movable in relation to the bore 40 of the MRI machine A. The system S is operably coupled with the MRI machine A and being deployed by way of the guide-and-rail system (not shown) disposed in the bore 40. The tongue 70 is ready to engage with either the lower portion 202 via the locking feature 202*b* or the tilting feature 204 via the locking feature 204*b* (FIG. 3).

Figure 6C:
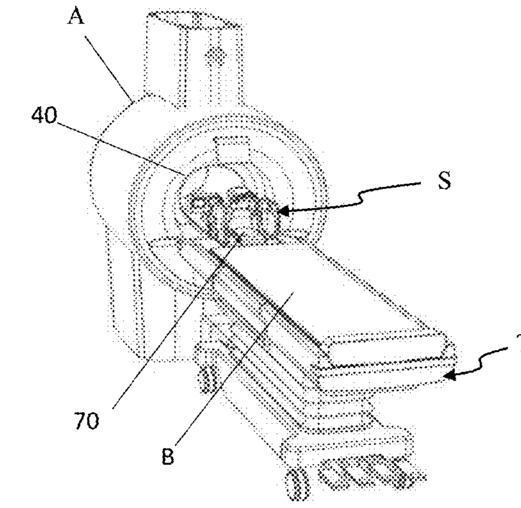
FIG. 6C is a diagram illustrating a perspective view of the head coil system, as shown in FIGS. 6A and 6B, deployed and coupling with a tongue of a bed of a medical transporter for use with the MRI machine, in accordance with an embodiment of the present disclosure.

Referring to FIG. 6C, this diagram illustrates a perspective view of a head coil system S, as shown in FIGS. 6A and 6B, deployed and coupling with the tongue 70 of the bed B of a medical transporter T for use with an MRI machine A, in accordance with an embodiment of the present disclosure. The system S is engaged with the bed B of a medical transporter T. In the deployed state, the system S is moved away from the bore 40 of the MRI machine A and toward the tongue 70, wherein the tongue 70 is fully engaged by rolling the transporter T toward the MRI machine A. The system S is operably coupled with the MRI machine A and deployed by way of the guide-and-rail system (not shown) disposed in the bore 40. The tongue 70 is engaged with either the lower portion 202 via the locking feature 202*b* or the tilting feature 204 via the locking feature 204*b* (FIG. 3). Medical personnel, such as an MRI technician, may then adjust the upper portion 201 in relation to the lower portion 202 and tongue 70 by way of articulation, disposition, and engagement. Further, fine adjustments may be made by way of articulation, disposition, and engagement of any sub-portions thereof. Even further, fine adjustments may be made by way of a controller configured by way of a set of executable instructions to determine geometry of the patient P, including the head H, and to automatically make the fine adjustments via at least one electromechanical actuator.

Figure 6D:
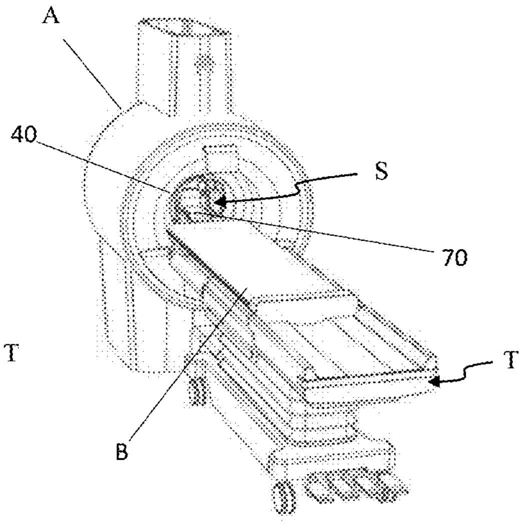
FIG. 6D is a diagram illustrating a perspective view of the head coil system as shown in FIGS. 6A-6C, coupled with the tongue of the bed of the medical transporter for use with the MRI machine, in accordance with an embodiment of the present disclosure.

Referring to FIG. 6D, this diagram illustrates a perspective view of a head coil system S, as shown in FIGS. 6A-6C, coupled with the tongue 70 of the bed B of the medical transporter T for use with the MRI machine A, in accordance with an embodiment of the present disclosure. The bed B may be slidably moved in relation to the transporter T and toward the bore 40, whereby the system S re-enters the bore 40. Thus, the system S is ready for use with the machine A in imaging the head H of the patient P.

Referring back to FIGS. 6A to 6D, the head coil system S may be adjustable or, alternatively, fixed or integrally formed, wherein the head coil system S is storable in the MRI machine A and deployable therefrom for use. In some embodiments of the present disclosure, the transporter T comprises an MRI table, whereby a need for a stretcher is eliminated. In so eliminating the need for a separate stretcher, otherwise typically required in relation to related art MRI systems, an emergency patient can be more rapidly imaged in order to accelerate diagnosis and therapy. In a transporter T that comprises an MRI table, the related art needs to transfer a patient P from a related art stretcher to an MRI table is eliminated. The head coil system S is configured to store in an MRI machine A, e.g., by sliding the head coil system S into the MRI machine A when not in use, and for deployment of the head coil system S by sliding the head coil system S from the MRI machine A for use, whereby a need for moving a related art head coil from a cabinet is eliminated. In the head coil system S, the tongue portion 70 is dockable with either the lower portion 202 or the tilting feature 204 by moving the transporter T to the MRI machine A, thereby efficiently disposing the head coil system S in relation to a head H of a patient P, and thereby efficiently readying the head H of the patient P for imaging. In the system S, the tongue 70 is undockable from either the lower portion 202 or the tilting feature 204 by moving the transporter T away from the MRI machine A, thereby efficiently readying the patient P for therapy.

Figure 7A:
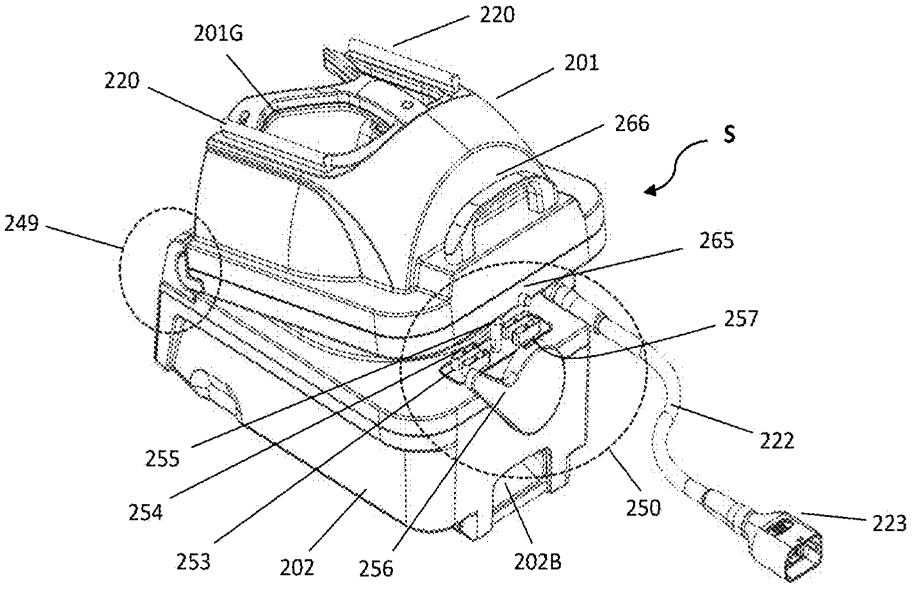
FIG. 7A is a diagram illustrating a perspective view of a head coil system, an upper portion decoupled and unlocked in relation to a lower portion at a forward section, in accordance with an embodiment of the present disclosure.

Referring to FIG. 7A, this diagram illustrates, in a perspective view, a head coil system S comprising a plurality of portions, such as an upper portion 201 and a lower portion 202, wherein the upper portion 201 is decoupled and unlocked in relation to the lower portion 202 at a forward section (forward in relation to an orientation of a medical transporter T), as shown in FIGS. 2-4C, in accordance with an embodiment of the present disclosure. The head coil system S comprises: a plurality of portions, such as an upper portion 201 and a lower portion 202 (FIG. 3), each portion of the plurality of portions comprising a magnetically conductive receiver coil, such as an upper coil 201*c* and a lower coil 202*c*, and a frame, such as an upper frame 201*f* and a lower frame 202*f*, configured to accommodate the magnetically conductive receiver coil, and each portion of the plurality of portions configured to couple and decouple with another portion of the plurality of portions; a coupling feature 250 configured to at least one of couple, lock, unlock, and decouple at least one portion of the plurality of portions in relation to another at least one portion of the plurality of portions; and a tilting feature 204 configured to dispose at least one portion of the plurality of portions at an angle in relation to a horizontal plane at an angle α in relation to a horizontal plane (not shown). The angle α comprises a range of approximately 0 degrees to approximately 10 degrees. Use of the tilting feature 204 is optional and may be desirable depending on at least one of physical attributes of the patient P, the head H, and the nose N.

Still referring to FIG. 7A, for example, the plurality of portions comprises an upper portion 201 and a lower portion 202. The upper portion 201 is configured to operably couple with the lower portion 202. The lower portion 202 is configured to operably couple with the upper portion 201. The upper portion 201 is configured to interchange with at least one module (not shown). The at least one module comprises at least one of a two-loop module and a horseshoe module.

Still referring to FIG. 7A, the tilting feature 204 is configured to couple, lock, unlock, and decouple the lower portion 202 in relation to a bed B of a medical transporter T. By example only, the tilting feature 204 comprises at least one of a wedge configuration and a trough configuration complementing that of the bed B.

Still referring to FIG. 7A, the system S further comprises a viewing accessory 203 configured to facilitate viewing of an environment outside an MRI machine A. The viewing accessory 203 comprises a mirror 203*b*, for example, as shown in FIG. 3. The viewing accessory 203 comprises a mounting feature 203*a* configured to couple the viewing accessory 203 with the upper frame 201*f*.

Still referring to FIG. 7A, the magnetically conductive receiver coil, such as an upper coil 201*c* and a lower coil 202*c*, comprises at least one of copper and a copper tube. For example, the magnetically conductive receiver coil provides high performance in relation to an MRI machine A having a low magnetic field, such as a magnetic field of approximately 0.5 Tesla. For example, the copper tube comprises a diameter of approximately 3⁄16 inch. By example only, the magnetically conductive receiver coil was matched to approximately 30 Ohms and measured while at least one per-amplifier is coupled with at least one channel; and a blocking circuit was used. In an embodiment of the system S, the magnetically conductive receiver coil comprises a shorted "figure-8-shape" caps were shorted, thereby providing a signal-to-noise ratio (SNR) that was higher than without so shorting.

Still referring to FIG. 7A, in some embodiments of the system S, the lower portion 202 comprises a magnetically conductive receiver coil having lengthy loops, e.g., in a range of approximately 16 inches to approximately 12 inches. In some embodiments of the system S, the upper portion 201 comprises a frame 201*f* having a V-shaped configuration (FIG. 2) for accommodating a nose N of a patient P and eye-holes 201*g*, each eye-hole 201*g* having a length approximately 140 mm and width of approximately 60 mm to accommodate a plurality of eye dispositions of a plurality of patients P and to improve human factors for the patient P during an imaging experience. The viewing accessory 203 (FIG. 3) can be adjusted relative to the eyeholes 201*g* to achieve optimum patient comfort.

Still referring to FIG. 7A, the coupling feature 250 is configured to operably couple with the lower portion 202, e.g., at a forward section, for example. The coupling feature 250 comprises a registration feature 251 and a locking feature 252. The registration feature 251 comprises a base plate 253, a plurality of connector 254 coupled with the base plate 253, and a post 255 coupled with the base plate 253. The plurality of connector 254 and the post 255 are configured to couple with complementary features of the upper portion 201. The locking feature 252 comprises a lever 256 for facilitating manual locking and a notch 257 configured to engage and couple with a post 265 of the upper portion 201. By rotating the lever 256, e.g., in a clockwise direction, the post 265 engages and is urged into a channel 258. By fully rotating the lever 256, e.g., in a clockwise direction to an end of its travel, the post 265 becomes fully engaged in the channel 258, thereby securing and locking the upper portion 201 in relation to the lower portion 202. The channel 258 comprises a curve shape. By examples, only, the curve shape comprises at least one of a cochleoid, a cardioid, a limaçn of Pascal, a spiral, and a logarithmic spiral. The upper portion 201 comprises a handle 266 configured to accommodate a user's hand (not shown), e.g., for facilitating coupling and decoupling of the upper portion 201 in relation to the lower portion 202 when the upper portion 201 is unlocked from the lower portion 202.

Figure 7B:
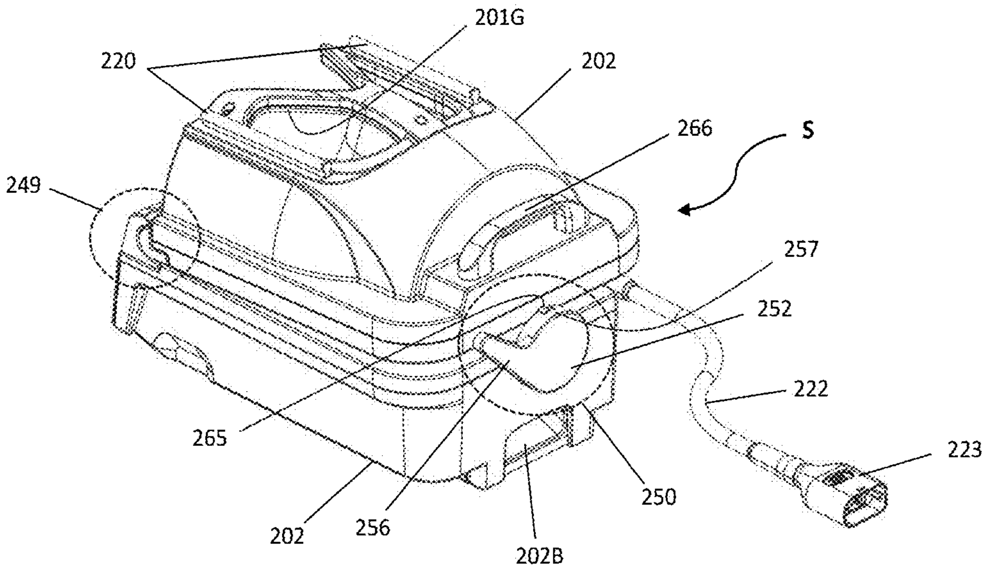
FIG. 7B is a diagram illustrating a perspective view of the head coil system, as shown in FIG. 7A, the upper portion coupled and unlocked in relation to the lower portion at the forward section, in accordance with an embodiment of the present disclosure.

Referring to FIG. 7B, this diagram illustrates, in a perspective view, the head coil system S comprising the plurality of portions, such as the upper portion 201 and the lower portion 202, as shown in FIG. 7A, wherein the upper portion 201 is coupled and unlocked in relation to the lower portion 202 at the forward section, in accordance with an embodiment of the present disclosure.

Figure 7C:
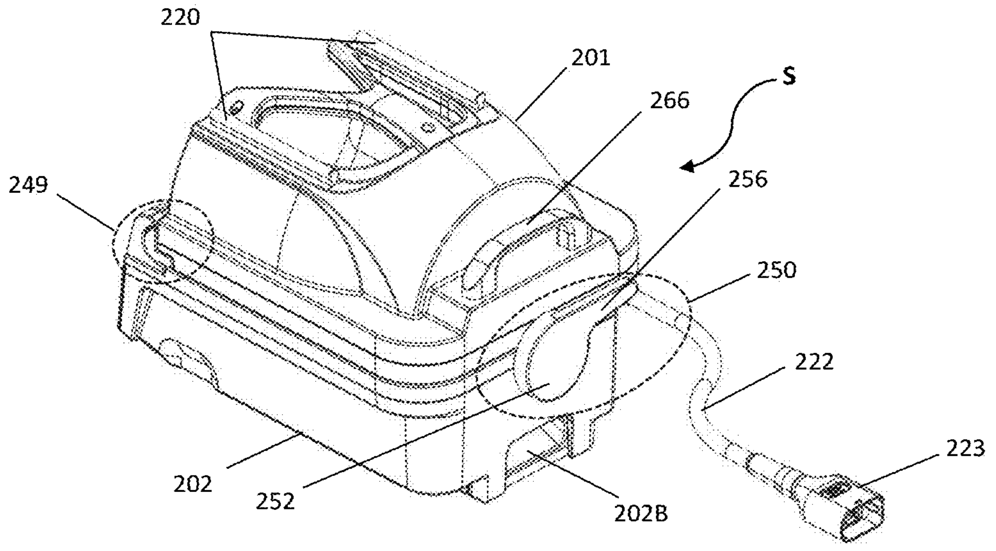
FIG. 7C is a diagram illustrating a perspective view of the head coil system, as shown in FIG. 7B, the upper portion coupled and locked in relation to the lower portion at the forward section, in accordance with an embodiment of the present disclosure.

Referring to FIG. 7C, this diagram illustrates, in a perspective view, the head coil system S comprising the plurality of portions, such as the upper portion 201 and the lower portion 202, as shown in FIG. 7B, wherein the upper portion 201 is coupled and locked in relation to the lower portion 202 at the forward section, in accordance with an embodiment of the present disclosure.

Figure 7D:
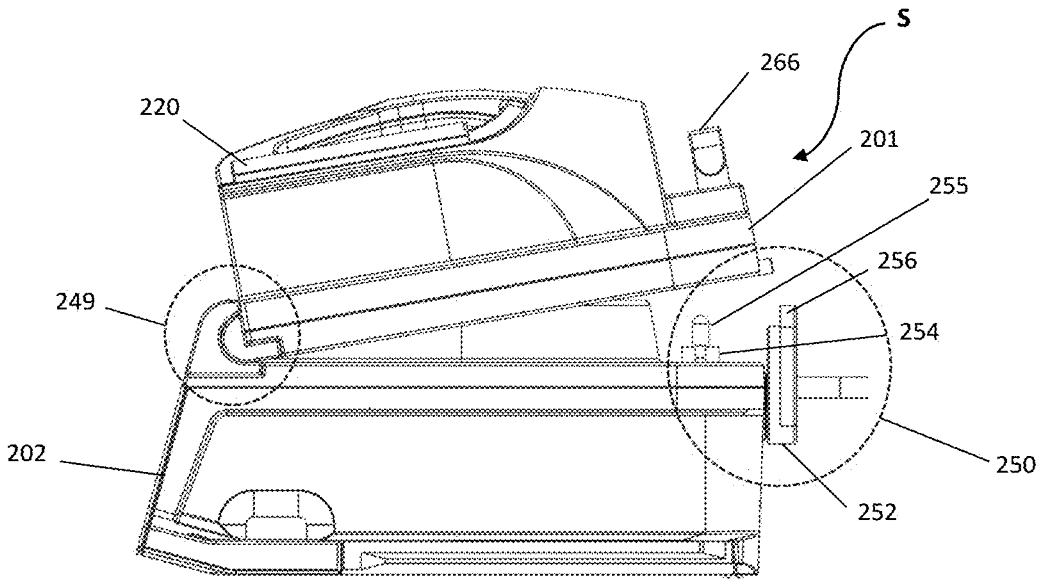
FIG. 7D is a diagram illustrating a side view of the head coil system, as shown in FIG. 7A, the upper portion decoupled and unlocked in relation to the lower portion at the forward section, in accordance with an embodiment of the present disclosure.

Referring to FIG. 7D, this diagram illustrates, in a side view, the head coil system S comprising the plurality of portions, such as the upper portion 201 and the lower portion 202, as shown in FIG. 7A, wherein the upper portion 201 is decoupled and unlocked in relation to the lower portion 202 at the forward section, in accordance with an embodiment of the present disclosure.

Figure 7E:
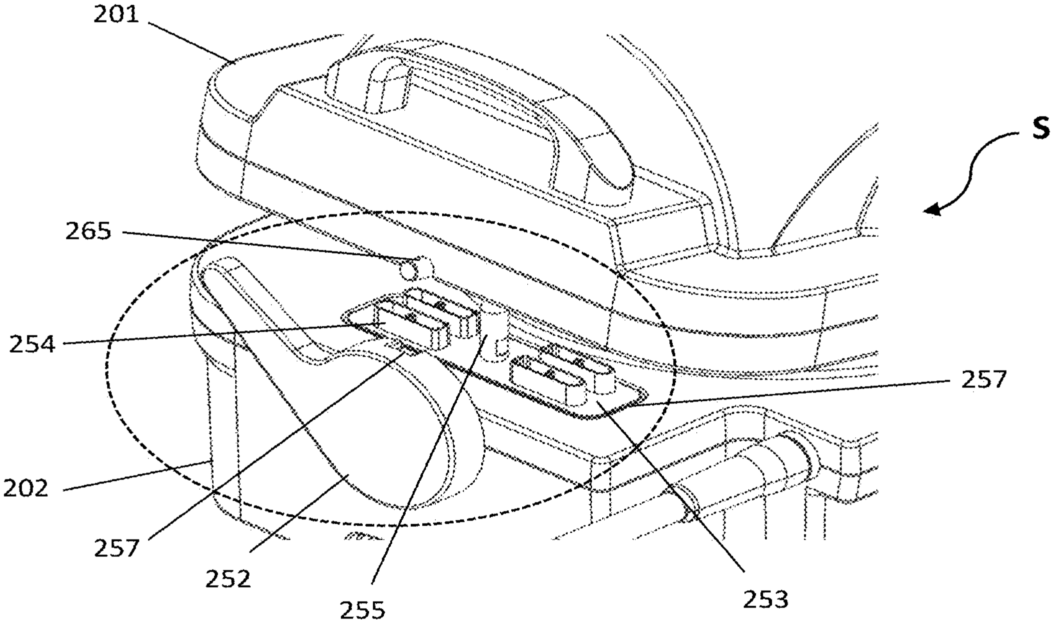
FIG. 7E is a diagram illustrating a cutaway closeup perspective view of the aft coupling feature of the head coil system, as shown in FIG. 7A, the upper portion decoupled and unlocked in relation to the lower portion at the forward section, in accordance with an embodiment of the present disclosure.

Referring to FIG. 7E, this diagram illustrates, in a cutaway closeup perspective view, the coupling feature 250 of the head coil system S, as shown in FIG. 7A, wherein the upper portion 201 is decoupled and unlocked in relation to the lower portion 202 at the forward section, in accordance with an embodiment of the present disclosure. The coupling feature 250 comprises the registration feature 251 and the locking feature 252. The registration feature 251 comprises the base plate 253, the plurality of connectors 254 coupled with the base plate 253, and the post 255 coupled with the base plate 253. The plurality of connectors 254 and the post 255 are configured to couple with complementary features (not shown) of the upper portion 201. The locking feature 252 comprises the lever 256 for facilitating manual locking and the notch 257 configured to engage and couple with the post 265 of the upper portion 201. By rotating the lever 256, e.g., in a clockwise direction, the post 265 engages and is urged into the channel 258.

Figure 7F:
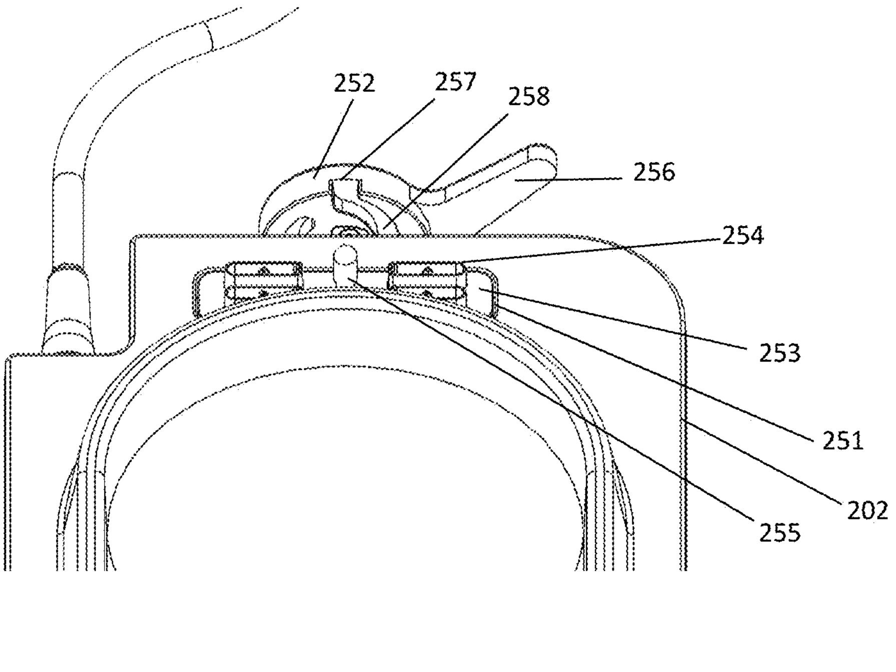
FIG. 7F is a diagram illustrating a top cutaway closeup perspective view of the lower portion of the head coil system having come of the components of the after coupling feature, in accordance with an embodiment of the present disclosure.

Referring to FIG. 7F, this diagram illustrates, in another top cutaway closeup perspective view, the lower portion 202 of the head coil system S, as shown in FIG. 7A, in accordance with an embodiment of the present disclosure. By rotating the lever 256, e.g., in a clockwise direction, the post 265 engages and is urged into the channel 258. By fully rotating the lever 256, e.g., in a clockwise direction to an end of its travel, the post 265 becomes fully engaged in the channel 258, thereby securing and locking the upper portion 201 in relation to the lower portion 202. To unlock the upper portion 201 from the lower portion 202, the lever 256 is rotated in a counterclockwise direction, thereby releasing the post 265 from the channel 258 and through the notch 257. The channel 258 comprises a curve shape. By examples, only, the curve shape comprises at least one of a cochleoid, a cardioid, a limaçon of Pascal, a spiral, and a logarithmic spiral. The upper portion 201 comprises a handle 266 configured to accommodate a user's hand (not shown), e.g., for facilitating coupling and decoupling of the upper portion 201 in relation to the lower portion 202 when the upper portion 201 is unlocked from the lower portion 202.

Figure 8:
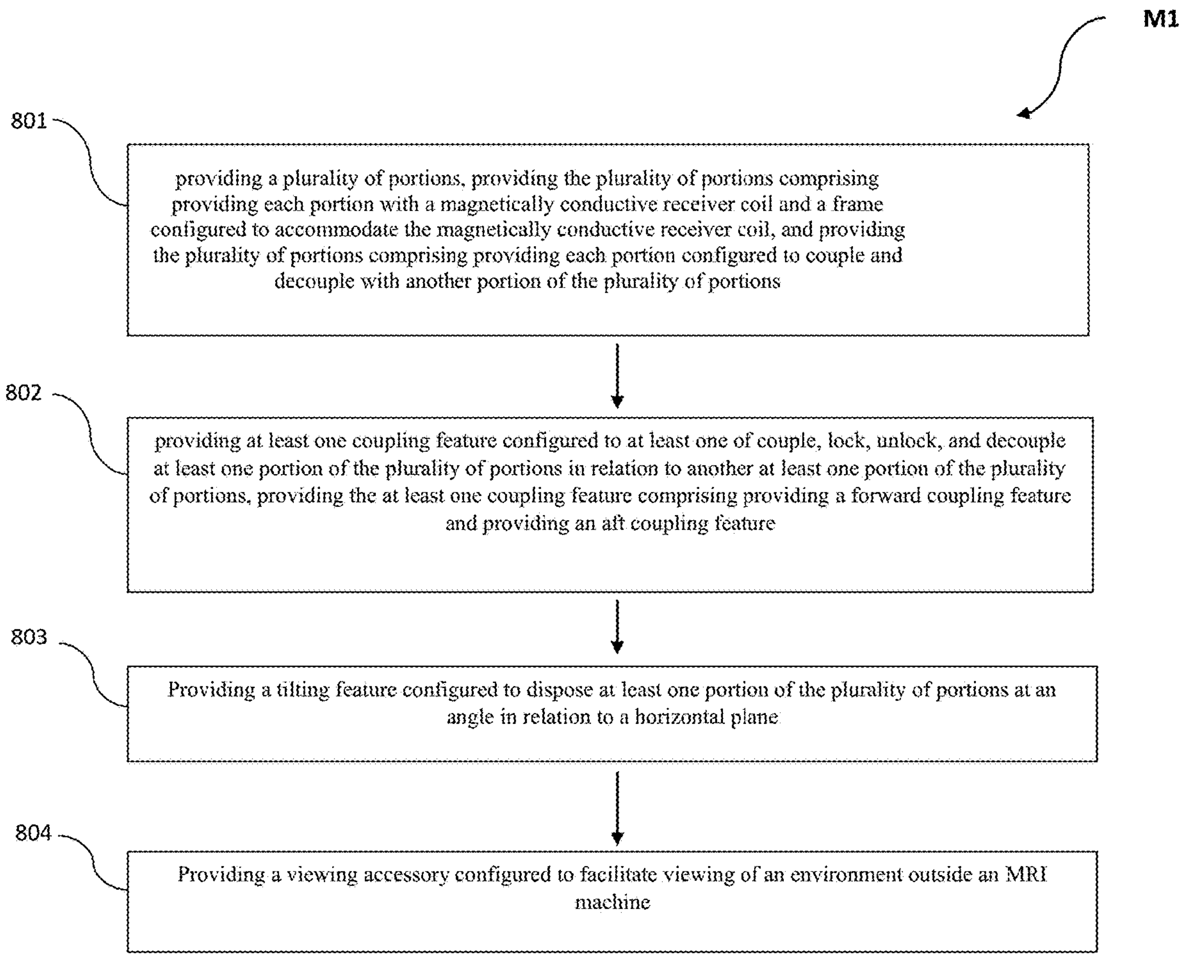
FIG. 8 is a flow diagram illustrating a method of fabricating a head coil system, in accordance with an embodiment of the present disclosure.

Referring to FIG. 8, this flow diagram illustrates a method M1 of fabricating a head coil system S, in accordance with an embodiment of the present disclosure. The method M1 comprises: providing a plurality of portions, e.g., an upper portion 201 and a lower portion 202, providing the plurality of portions comprising providing each portion, e.g., respectively, the upper portion 201 and the lower portion 202, with a magnetically conductive receiver coil, e.g., respectively, the upper coil 201*c* and the lower coil 202*c*, and a frame, e.g., an upper frame 201*f* and a lower frame 202*f*, configured to accommodate the magnetically conductive receiver coil, e.g., respectively, the upper coil 201*c* and the lower coil 202*c*, and providing the plurality of portions, e.g., respectively, the upper portion 201 and the lower portion 202, comprising providing each portion configured to couple and decouple with another portion, e.g., respectively, the lower portion 202 and the upper portion 201, of the plurality of portions, as indicated by block 801; providing at least one coupling feature configured to at least one of couple, lock, unlock, and decouple at least one portion, e.g., respectively, the upper portion 201 and the lower portion 202, of the plurality of portions in relation to another at least one portion, e.g., respectively, the lower portion 202 and the upper portion 201, of the plurality of portions, providing the at least one coupling feature comprising providing a forward coupling feature 250 and providing an aft coupling feature 249, as indicated by block 802; and providing a tilting feature 204 configured to dispose at least one portion of the plurality of portions 80 at an angle α in relation to a horizontal plane (not shown), as indicated by block 803. The method M1 further comprises providing a viewing accessory 203 configured to facilitate viewing of an environment outside an MRI machine, as indicated by block 804.

Still referring to FIG. 8, in the method M1, providing the plurality of portions, as indicated by block 801, comprises providing an upper portion 201 and providing a lower portion 202. At least one of providing the upper portion 201 comprises configuring the upper portion 201 to operably couple with the lower portion 202 and providing the lower portion 202 comprises configuring the lower portion 202 to operably couple with the upper portion 201. Providing the upper portion 201 comprises configuring the upper portion 201 to interchange with at least one module (not shown). Providing the upper portion 201 comprises configuring the upper portion 201 to interchange with the at least one module comprising at least one of a two-loop module and a horseshoe module.

Still referring to FIG. 8, in the method M1, providing the tilting feature 204, as indicated by block 802, comprises configuring the tilting feature 201 to couple, lock, unlock, and decouple the lower portion 202 in relation to a bed B of a medical transporter T. Providing the tilting feature 204 comprises configuring the tilting feature 204 to dispose at least one portion of the plurality of portions at the angle α comprising a range of approximately 0 degrees to approximately 10 degrees. Providing the tilting feature 204 comprises at least one of providing a wedge configuration and providing a trough configuration complementing that of the bed B.

Still referring to FIG. 8, in the method M1, providing each portion with a magnetically conductive receiver coil comprises providing at least one of copper and a copper tube. Providing the magnetically conductive receiver coil comprises providing the magnetically conductive receiver coil having a high performance in relation to an MRI machine A having a low magnetic field. Providing the magnetically conductive receiver coil comprises providing the magnetically conductive receiver coil having a high performance in relation to an MRI machine A having a low magnetic field of approximately 0.5 Tesla.

Figure 8A:
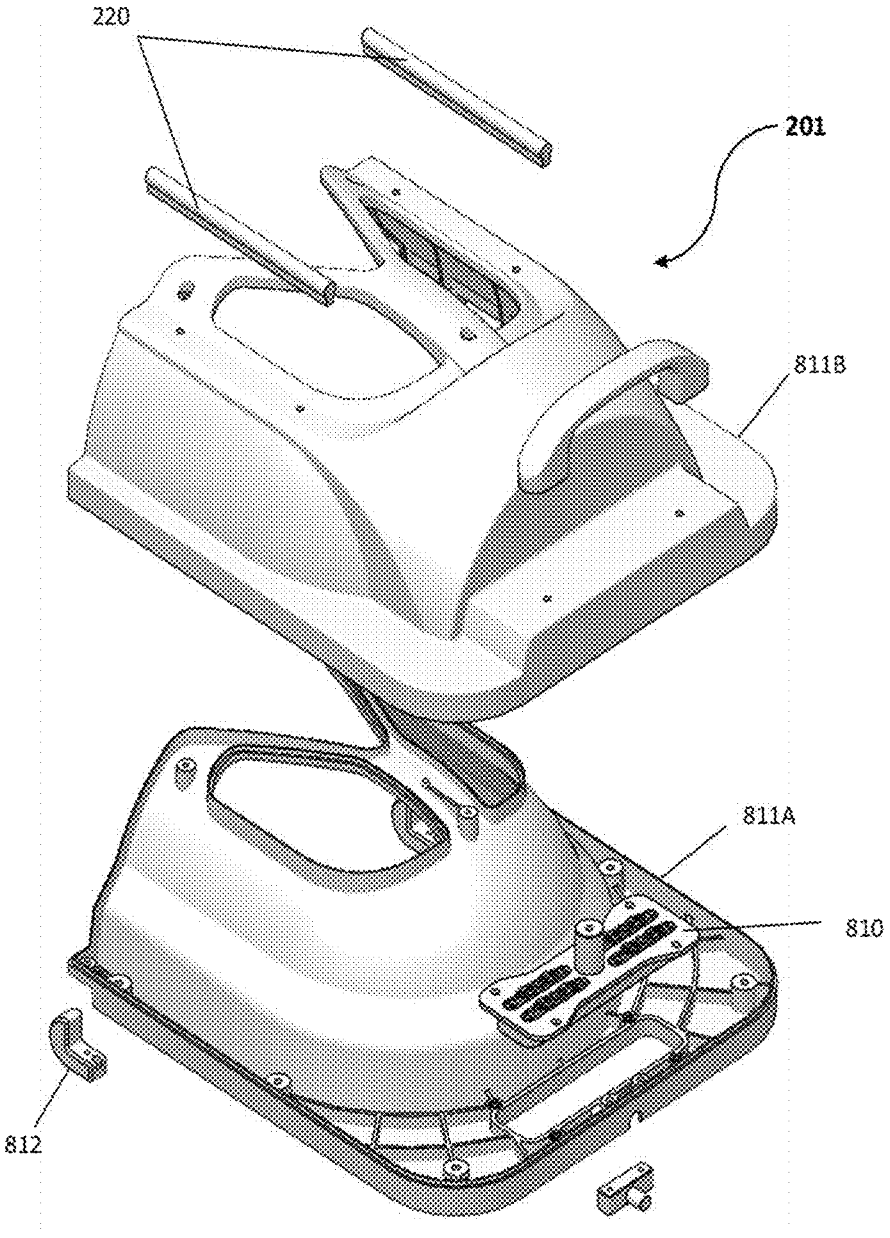
FIG. 8A is a diagram illustrating an exploded top perspective view of the upper portion, comprising an inner former and an outer former, as fabricated by the method, as shown in FIG. 8, in accordance with an embodiment of the present disclosure.
Figure 8B:
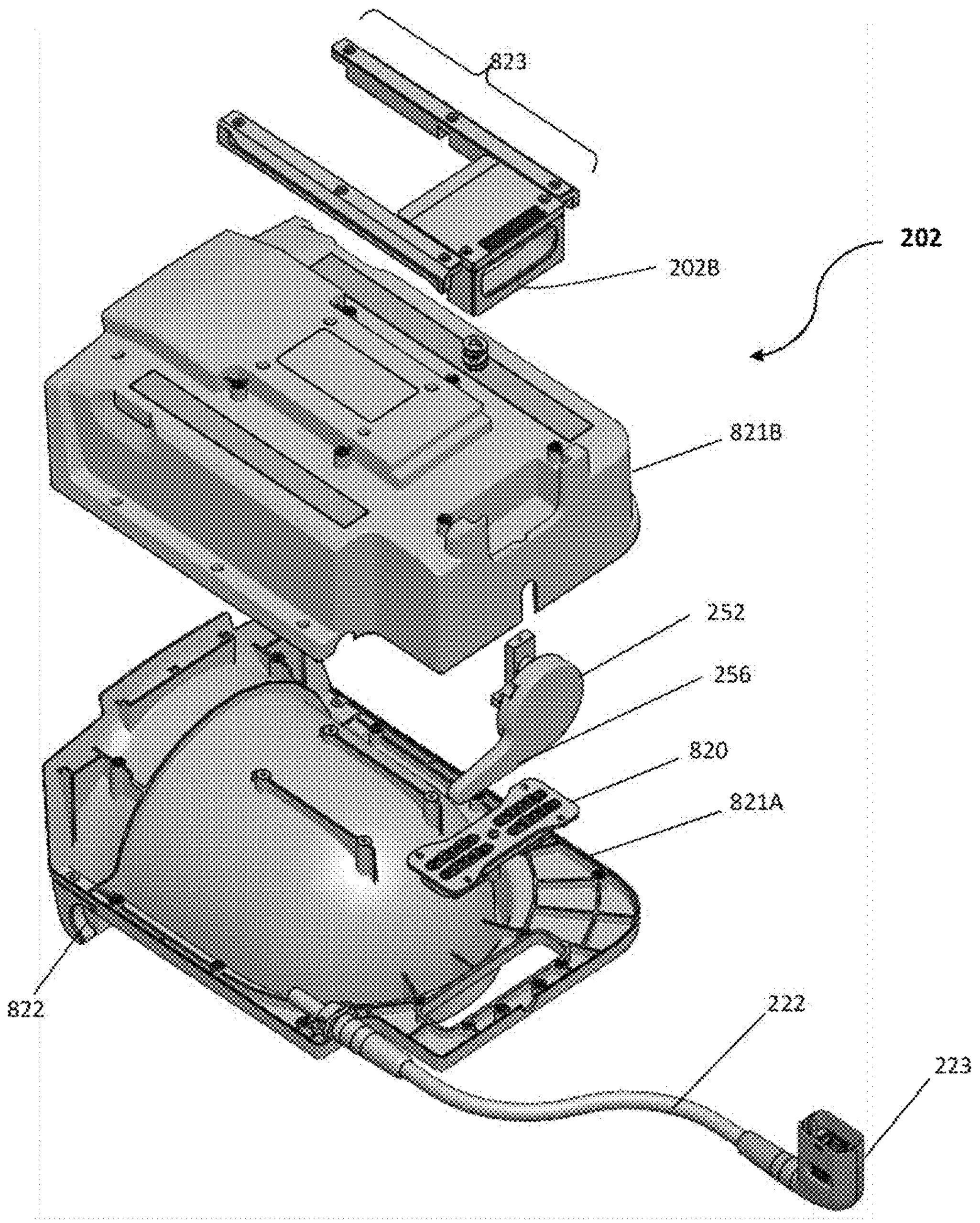
FIG. 8B is a diagram illustrating an exploded bottom perspective view of the lower portion, comprising an inner former and an outer former, as fabricated by the method, as shown in FIG. 8, in accordance with an embodiment of the present disclosure.

Referring to FIG. 8A and referring back to FIG. 8, this diagram illustrates in an exploded top perspective view, fabrication of the upper portion 201, comprising an inner former 811*a* and an outer former 811*b*, in accordance with an embodiment of the present disclosure. In the method M1, providing the plurality of portions, as indicated by block 801, comprises providing an upper portion 201, wherein providing the upper portion 201 comprises assembling any electrical component, such as the magnetically conductive receiver coil and a connector plate 810, in relation to an inner former 811*a*. The aft coupling feature 249 comprises an upper coupler 812 configured to mate with a lower coupler 822 (FIG. 8B). At least one rail 220 is configured to couple with at least one of the upper frame 201*f* and the outer former 811*b*.

Referring to FIG. 8B and referring back to FIG. 8, this diagram illustrates in an exploded bottom perspective view, fabrication of the lower portion 202, comprising an inner former 821*a* and an outer former 821*b*, in accordance with an embodiment of the present disclosure. In the method M1, providing the plurality of portions, as indicated by block 801, comprises providing a lower portion 202 wherein providing the lower portion 202 comprises assembling any electrical component, such as the magnetically conductive receiver coil, a connector plate 820, and a cable connector 222 in relation to an inner former 821*a*. Providing the lower portion 202 further comprises providing the cable connector 222 having a length in a range sufficient to reach an Rx receptacle, e.g., an electrical receptacle of an imaging apparatus A. Providing the cable connector 222 comprises providing at least one of a plug adapter 223, e.g., a straight plug, and a coaxial cable. Providing the lower portion 202 further comprises a coupling feature 823 configured to couple the lower portion 202 with at least one of the bed B and the tilting feature 204. The coupling feature 823 comprises at least one of a mounting bracket and rails, by examples only. The coupling feature 823 is further configured to couple with a locking feature 202*b*.

Figure 8C:
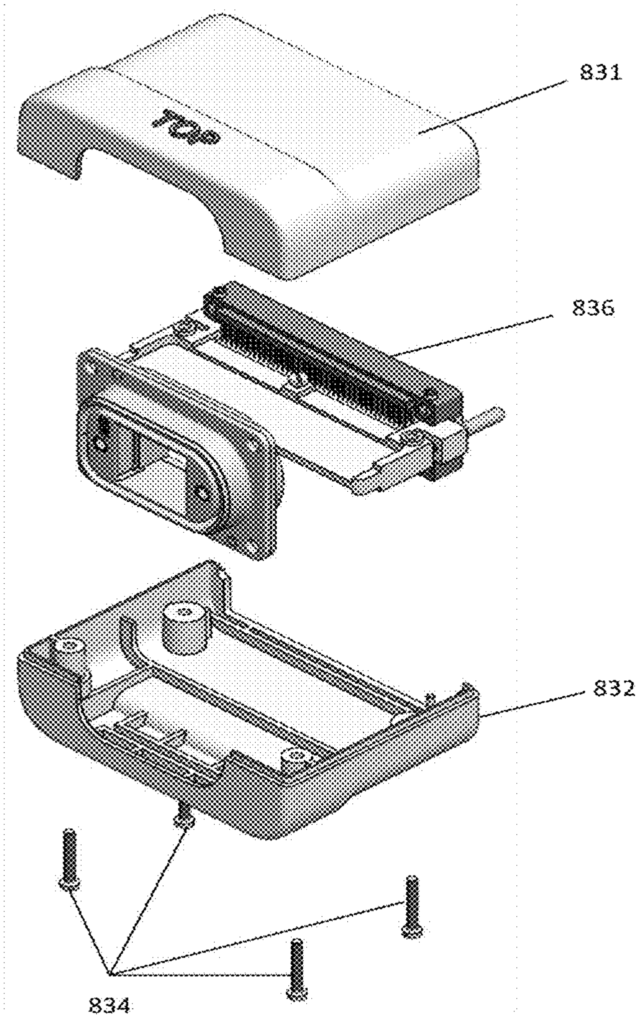
FIG. 8C is a diagram illustrating an exploded perspective view of the lower portion, comprising a cable with plug for a lower portion, as fabricated by the method, as shown in FIG. 8, in accordance with an embodiment of the present disclosure.

Referring to FIG. 8C and referring back to FIG. 8B, this diagram illustrates in an exploded perspective view, fabrication of a plug adapter 223, comprising an upper housing portion 831 and a lower housing portion 832, in accordance with an embodiment of the present disclosure. In the method M1, providing the plug adapter 223 comprises providing a housing comprising the upper housing portion 831 and a lower housing portion 832. The housing is configured to accommodate an electrical connector 836, e.g., an electrical adapter. The upper housing portion 831 and the lower housing portion 832 are each configured to couple with one another, e.g., via fasteners 834.

Figure 8D:
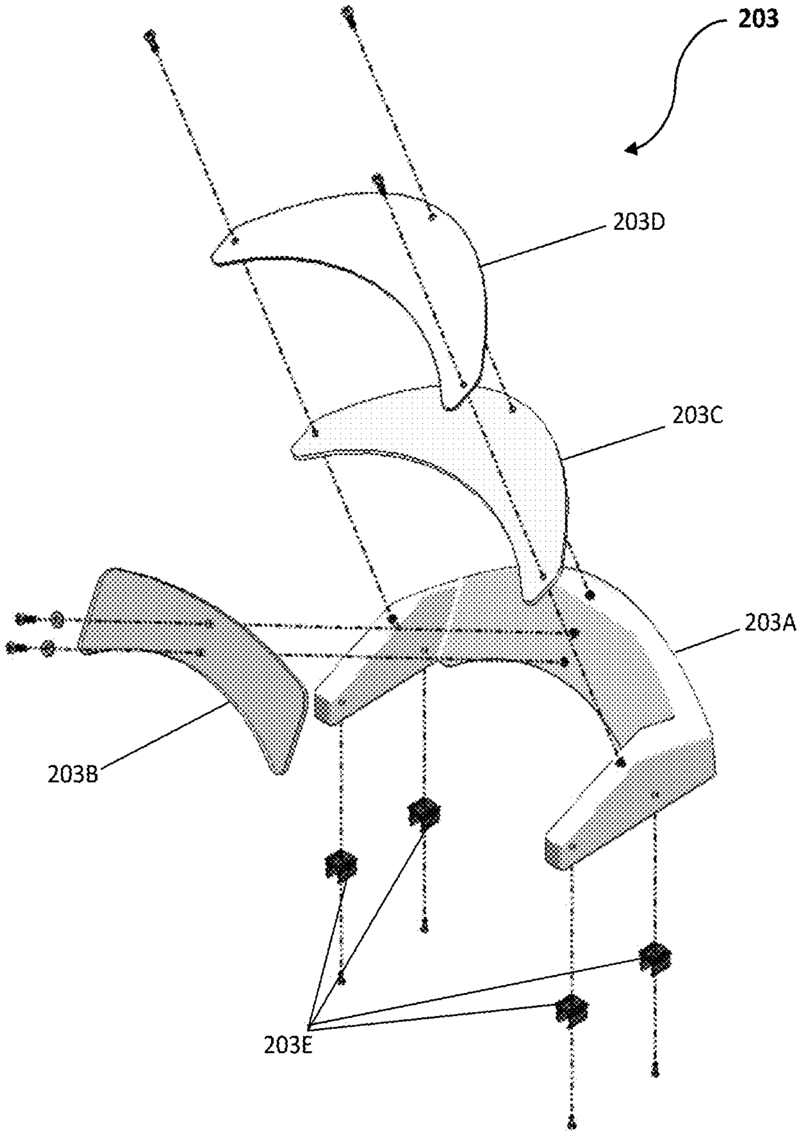
FIG. 8D is a diagram illustrating an exploded perspective view of a viewing accessory, as fabricated by the method, as shown in FIG. 8, in accordance with an embodiment of the present disclosure.
Figure 22:
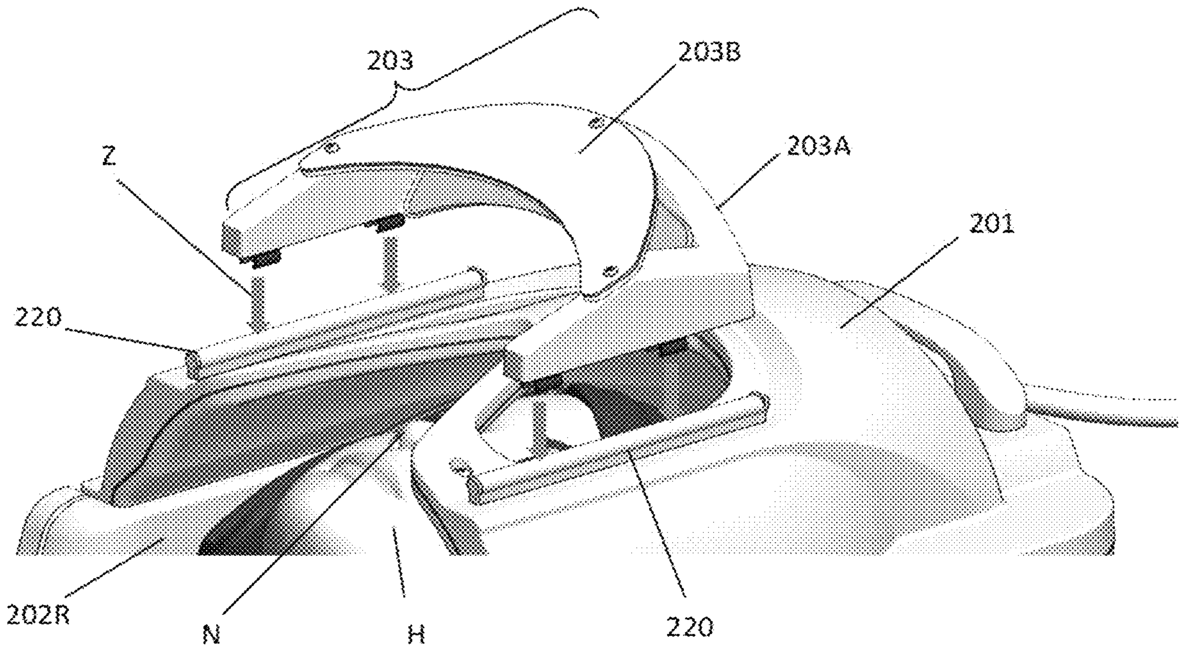
FIG. 22 is a diagram illustrating a perspective view of a viewing accessory of a head coil system (aft section), as shown in FIG. 16, the forward coupling feature coupled and locked, and the aft coupling feature coupled, in accordance with an embodiment of the present disclosure.
Figure 23:
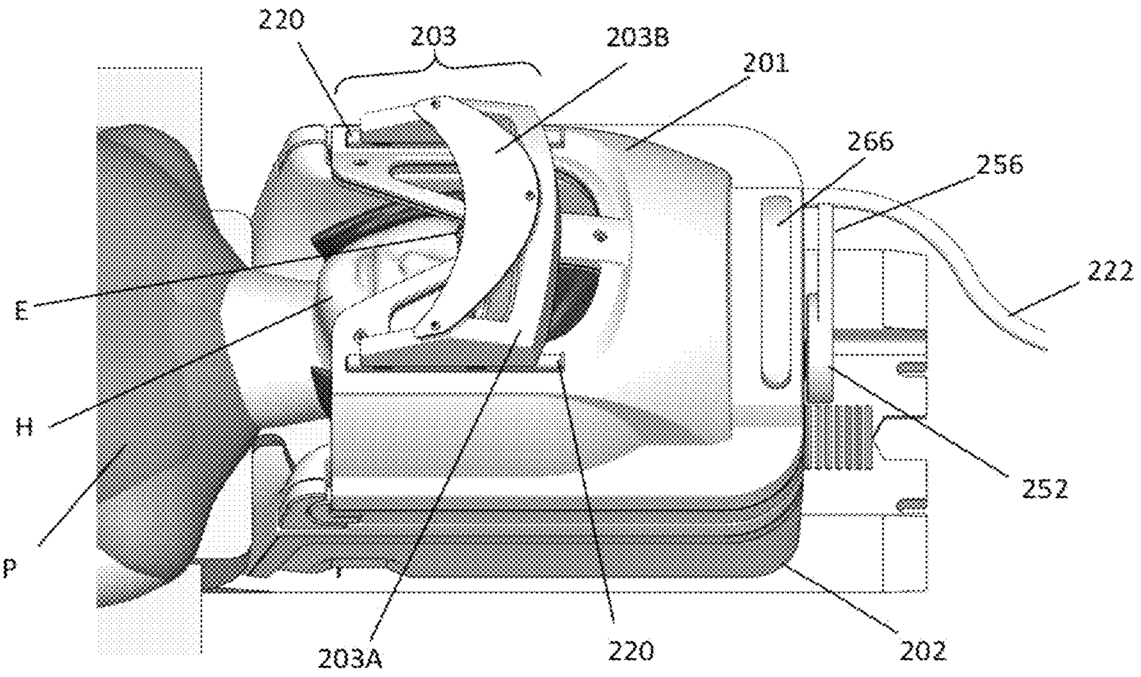
FIG. 23 is a diagram illustrating a perspective view of a head coil system, comprising the viewing accessory, as shown in FIG. 22, in accordance with an embodiment of the present disclosure.

Referring to FIG. 8D and referring back to FIG. 8, this diagram illustrates in an exploded perspective view, fabrication of viewing accessory 203, in accordance with an embodiment of the present disclosure. The method M1 further comprises providing the viewing accessory 203 configured to facilitate viewing of an environment outside an MRI machine A by a patient P, as indicated by block 804. Providing the viewing accessory 203 comprises providing a mounting feature 203*a* configured to couple the viewing accessory 203 with the upper frame 201*f*, e.g., as shown in FIGS. 22 and 23, a first reflective feature, e.g., a first mirror 203*b*, and a second reflective feature, e.g., a second mirror 203*c*, a second mirror cover 203*d*, one of guides (not shown) or a plurality of clips 203*e*. The mirrors comprise acrylic, by example only. The clips 203*e* comprise polyvinyl chloride (PVC), by example only.

Figure 9:
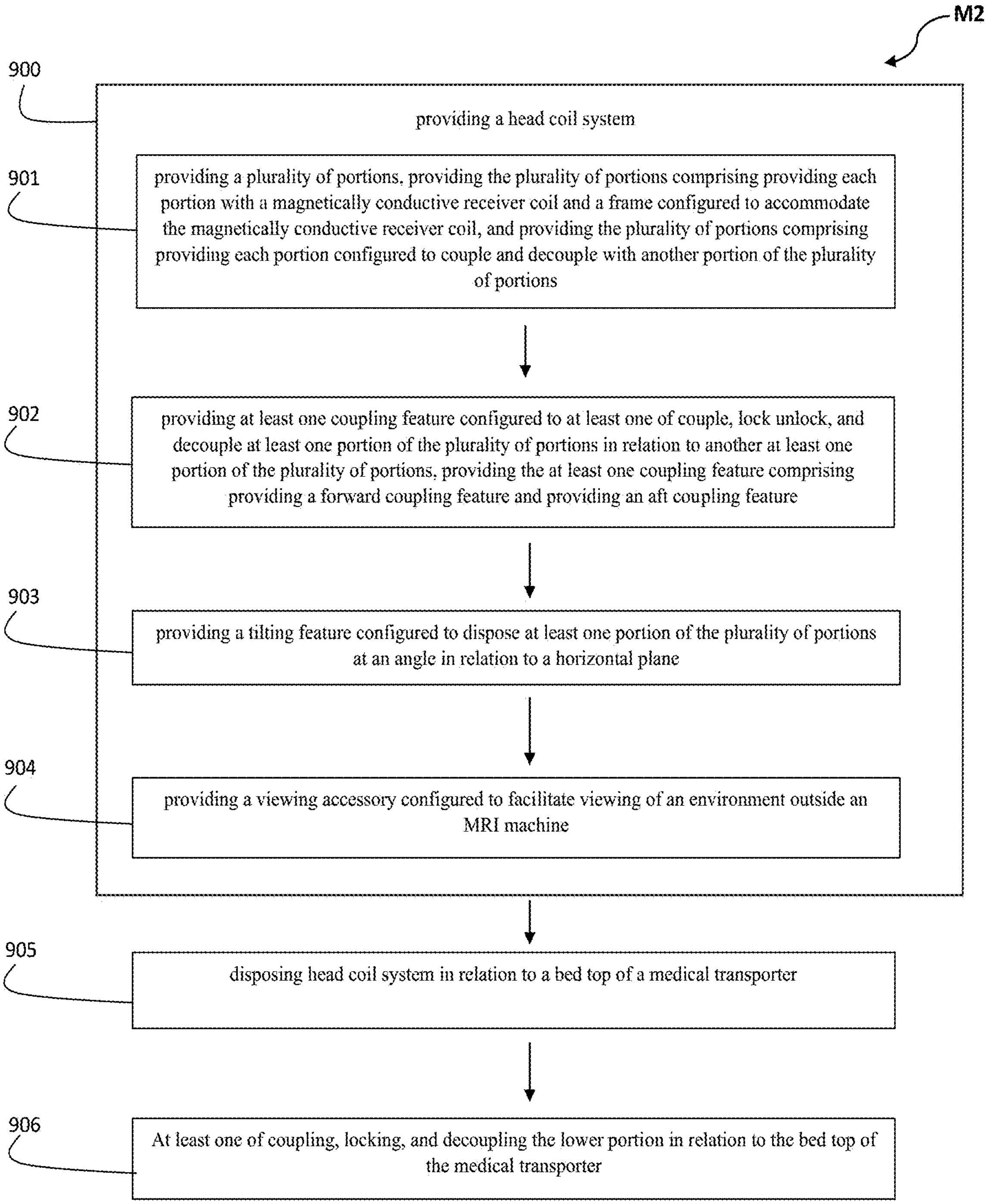
FIG. 9 is a flow diagram illustrating a method of using a head coil system, in accordance with an embodiment of the present disclosure.

Referring to FIG. 9 is a flow diagram illustrating a method M2 of using a head coil system S, in accordance with an embodiment of the present disclosure. The method M2 comprising: providing a head coil system S, as indicated by block 900, providing the head coil system S comprising: providing a plurality of portions, e.g., an upper portion 201 and a lower portion 202, providing the plurality of portions comprising providing each portion, e.g., respectively, the upper portion 201 and the lower portion 202, with a magnetically conductive receiver coil, e.g., respectively, the upper coil 201*c* and the lower coil 202*c*, and a frame, e.g., an upper frame 201*f* and a lower frame 202*f*, configured to accommodate the magnetically conductive receiver coil, e.g., respectively, the upper coil 201*c* and the lower coil 202*c*, and providing the plurality of portions, e.g., respectively, the upper portion 201 and the lower portion 202, comprising providing each portion configured to couple and decouple with another portion, e.g., respectively, the lower portion 202 and the upper portion 201, of the plurality of portions, as indicated by block 901; providing at least one coupling feature configured to at least one of couple, lock, unlock, and decouple at least one portion, e.g., respectively, the upper portion 201 and the lower portion 202, of the plurality of portions in relation to another at least one portion, e.g., respectively, the lower portion 202 and the upper portion 201, of the plurality of portions, providing the at least one coupling feature comprising providing a forward coupling feature 250 and providing an aft coupling feature 249, as indicated by block 902; and providing a tilting feature 204 configured to dispose at least one portion of the plurality of portions 80 at an angle α in relation to a horizontal plane (not shown), as indicated by block 903; and providing a viewing accessory 203 configured to facilitate viewing of an environment outside an MRI machine, as indicated by block 904; disposing head coil system S in relation to a bed B of a medical transporter T, as indicated by block 905; and at least one of coupling, locking, unlocking, and decoupling the lower portion 202 in relation to the bed B of the medical transporter T, as indicated by block 906.

Figure 10:
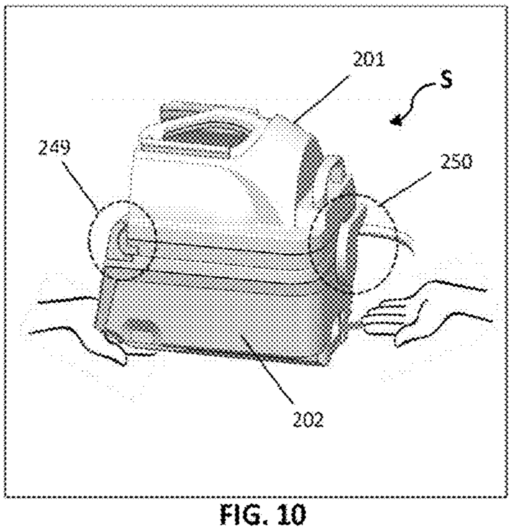
FIG. 10 is a diagram illustrating a side perspective view of a head coil system, as shown in FIGS. 2-7F and 9, the upper portion coupled and locked in relation to the lower portion at a forward section as well as at an aft section, in accordance with an embodiment of the present disclosure.

Referring to FIG. 10, this diagram illustrates, in a side perspective view, a head coil system S, as shown in FIGS. 2-7F and 9, comprising a plurality of portions, such as an upper portion 201 and a lower portion 202, wherein the upper portion 201 is coupled and locked in relation to the lower portion 202 at a forward section FWD as well as at an aft section AFT, in accordance with an embodiment of the present disclosure. In performing the method M2, a workflow comprises providing the system S, as indicated by step 900, for use with a medical transporter T. For example, the system S is manually transportable to the medical transporter T.

Figure 11:
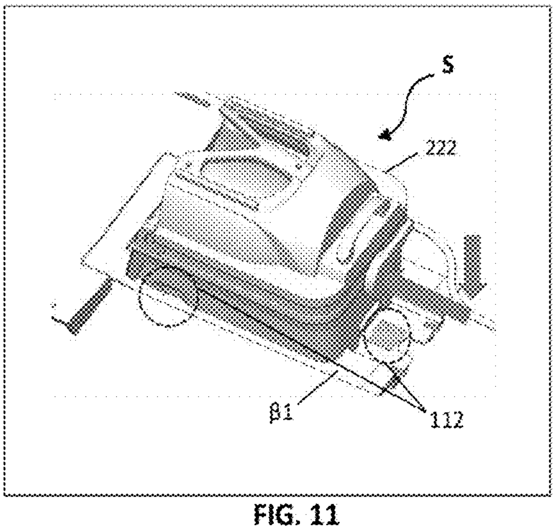
FIG. 11 is a diagram illustrating a top perspective view of the head coil system, as shown in FIG. 10, comprising a plurality of portions, the upper portion coupled and locked in relation to the lower portion at a forward section as well as at an aft section, in accordance with an embodiment of the present disclosure.

Referring to FIG. 11, this diagram illustrates, in atop perspective view, the head coil system S, as shown in FIG. 10, comprising a plurality of portions, such as an upper portion 201 and a lower portion 202, wherein the upper portion 201 is coupled and locked in relation to the lower portion 202 at a forward section FWD as well as at an aft section AFT, in accordance with an embodiment of the present disclosure. In performing the method M2, the workflow further comprises securing the system S in relation to a bed B of the medical transporter T. For example, securing the system S in relation to the bed B comprises: disposing the system S in relation to a trough B1 in the bed B; sliding the system S forward; and activating a coupler 112 configured to couple, lock, unlock, and decouple the system S in realization to the bed B, whereby a ratchet 111 aligns and engages (FIG. 12) with depressed markings 113, until a bed lock 113 clicks upon fully ratcheting.

Figure 12:
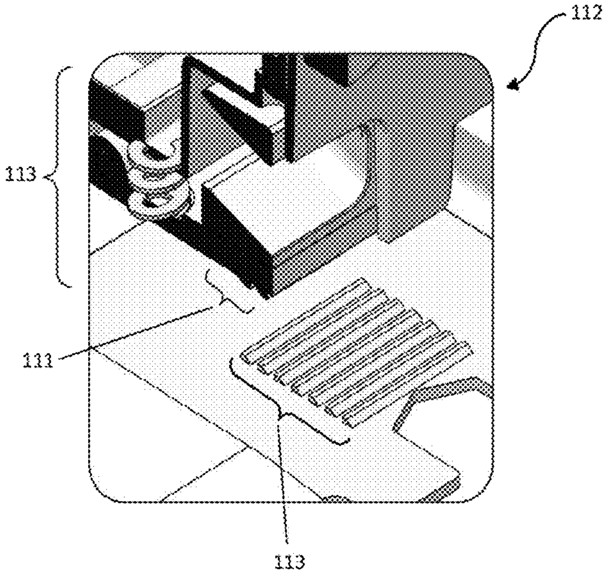
FIG. 12 is a diagram illustrating a closeup perspective view of a coupler of the system, as shown in FIG. 10, the coupler configured to couple, lock, unlock, and decouple the system in relation to the bed, in accordance with an embodiment of the present disclosure.

Referring to FIG. 12, this diagram illustrates, in a closeup perspective view, a coupler 112 of the system S, as shown in FIG. 10, the coupler 112 configured to couple, lock, unlock, and decouple the system S in realization to the bed B, whereby a ratchet 111 aligns and engages (FIG. 12) with depressed markings 113, until a bed lock 113 clicks upon fully ratcheting, in accordance with an embodiment of the present disclosure.

Figure 13:
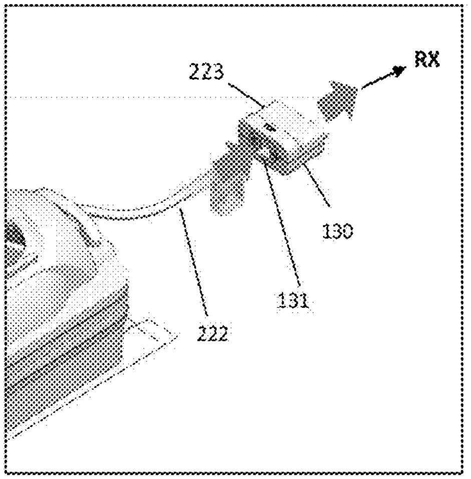
FIG. 13 is a diagram illustrating a cutaway perspective view of a cable connector of the system, as shown in FIG. 10, the cable connector configured to couple with a plug adapter to an Rx chain, in accordance with an embodiment of the present disclosure.

Referring to FIG. 13, this diagram illustrates, in a cutaway perspective view, a cable connector 222 of the system S, as shown in FIG. 10, the cable connector 222 configured to couple with a plug adapter 130 to a Rx chain (not shown), in accordance with an embodiment of the present disclosure. The plug adapter 130 comprises a plurality of orientation pins 131 configured to prevent incorrect alignment of the cable connector 222, wherein the connector 201 comprises a plurality of complementary receptacles (not shown). By example only, the plurality of orientation pins 131 comprises a plurality of Amphenol® pins. In performing the method M2, the workflow further comprises coupling the cable connector 222 with the plug adapter 130 to communicate with the (Rx) chain.

Figure 14:
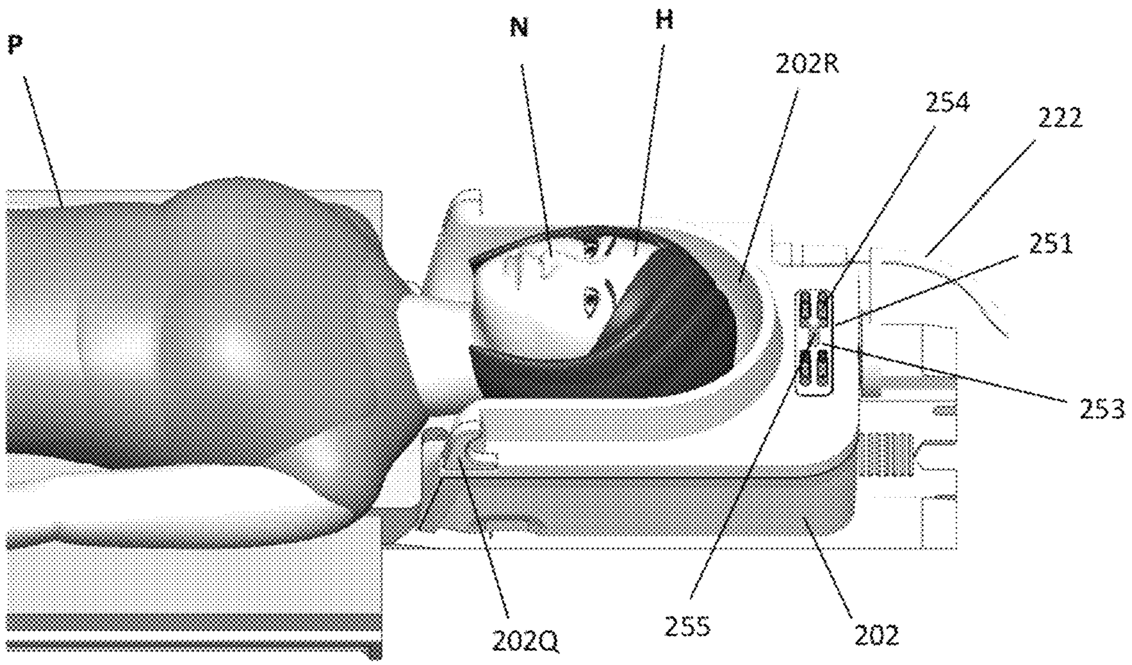
FIG. 14 is a diagram illustrating a perspective view of a lower portion of the system, as shown in FIG. 10, accommodating a head of a patent on a resting surface, in accordance with an embodiment of the present disclosure.

Referring to FIG. 14, this diagram illustrates, in a perspective view, a lower portion 202 of the system S, as shown in FIG. 10, accommodating a head H of a patent P on a resting surface 202*r*, in accordance with an embodiment of the present disclosure. In performing the method M2, the workflow further comprises disposing a head pad (not shown) on the resting surface 202*r* of the lower portion 202 and a neck pad FAB-04378 in place) at an aft section of the lower portion 202. The workflow further comprises disposing the head H of the patent P on the resting surface 202*r* of the lower portion 202. Disposing the head H comprises having the patient lean back onto the resting surface 202*r*

(now having the head pad and the neck pad) of the lower portion 202 and adjusting position of the head H in relation to isocenter markings (not shown).

Figure 15:
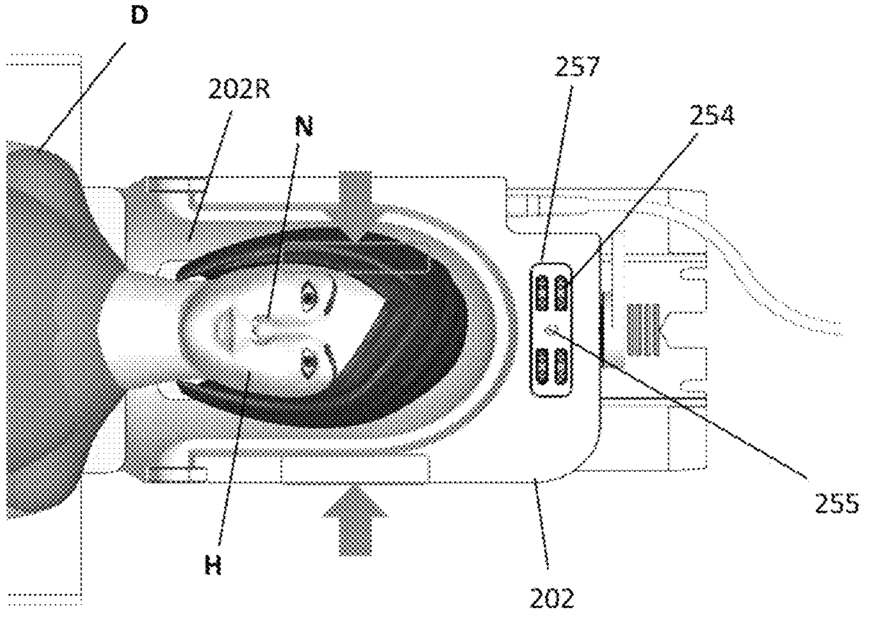
FIG. 15 is a diagram illustrating a top view of a lower portion of the system, accommodating the head of the patent on the resting surface, as shown in FIG. 14, in accordance with an embodiment of the present disclosure.

Referring to FIG. 15, this diagram illustrates, in a top view, a lower portion 202 of the system S, accommodating the head H of the patent P on the resting surface 202*r*, as shown in FIG. 14, in accordance with an embodiment of the present disclosure. In performing the method M2, the workflow further comprises immobilizing the head H by disposing at least one other pads around the head H, e.g., a foam pad.

Figure 16:
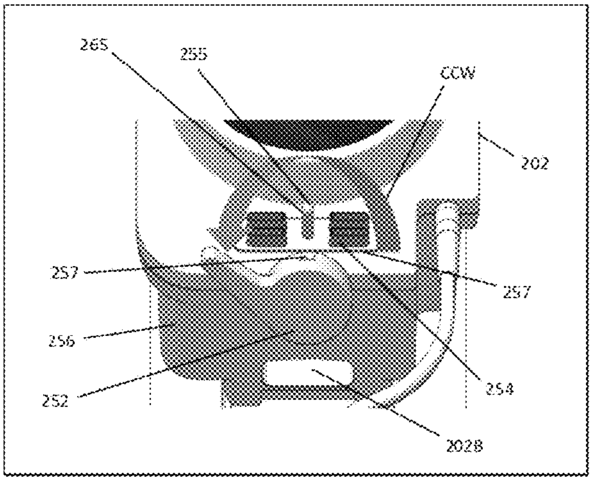
FIG. 16 is a diagram illustrating a top cutaway closeup perspective view of components of a forward coupling feature, as shown in FIG. 10, in accordance with an embodiment of the present disclosure.

Referring to FIG. 16, this diagram illustrates, in atop cutaway closeup perspective view, components of a coupling feature 250 that are disposed in relation to the lower portion 202 of a head coil system S, as shown in FIG. 10, in accordance with an embodiment of the present disclosure. The workflow further comprises verifying whether the lever 256 is rotated to the end of its travel in a counterclockwise direction CCW (decoupled and unlocked).

Figure 17:
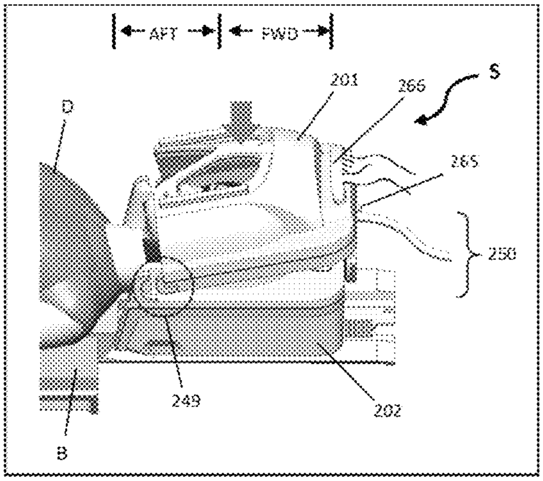
FIG. 17 is a diagram illustrating a side perspective view of a head coil system, as shown in FIG. 10, comprising a forward coupling feature and an aft coupling feature, in accordance with an embodiment of the present disclosure.

Referring to FIG. 17, this diagram illustrates, in a side perspective view, a head coil system S, as shown in FIG. 10, comprising at least one coupling feature, the at least one coupling feature comprising a forward coupling feature 250 and an aft coupling feature 249, in accordance with an embodiment of the present disclosure. The workflow further comprises lowering the upper portion 201 in relation to the lower portion 202, e.g., by manually operating the handles 266.

Figure 18:
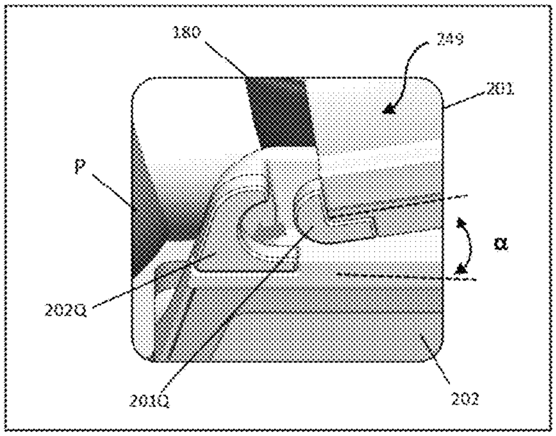
FIG. 18 is a diagram illustrating a closeup side perspective view of the aft coupling feature of the head coil system, as shown in FIG. 17, in accordance with an embodiment of the present disclosure.

Referring to FIG. 18, this diagram illustrates, in a closeup side perspective view, the aft coupling feature 249 of the head coil system S, as shown in FIG. 17, in accordance with an embodiment of the present disclosure. The coupling feature 249 is configured to operably couple the upper portion 201 with the lower portion 202, e.g., at an aft section AFT, for example. The coupling feature 249 comprises: a lower registration feature 202*q* coupled with the lower portion 202 at an aft section thereof; and an upper registration feature 201*q* coupled with the upper portion 202 at an aft section thereof, the upper registration feature 201*q* and the lower registration feature 202*q* complementary configured to register with one another. The upper registration feature 201*q* is further configured to rotate in relation to the lower registration feature 202*q*, e.g., at an angle α in a range of approximately 0 degrees to approximately 10 degrees for accommodating the tilting feature 204 (FIG. 3). Optionally, coupling feature 249 is configured to lock and unlock the upper portion 201 in relation to the lower portion 202. The workflow further comprises aligning the coupling feature 249, e.g., by registering the upper registration feature 201*q* with the lower registration feature 202*q*, e.g., by moving the upper registration feature 201*q* to the lower registration feature 202*q* in a direction 180.

Figure 19:
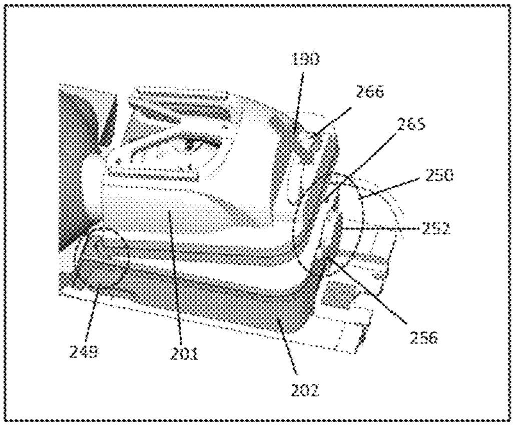
FIG. 19 is a diagram illustrating another side perspective view of the head coil system, as shown in FIG. 10, the upper portion decoupled and unlocked in relation to the lower portion at the forward section and coupled at the aft section, in accordance with an embodiment of the present disclosure.

Referring to FIG. 19, this diagram illustrates, in another side perspective view, the head coil system S, as shown in FIG. 10, comprising a plurality of portions, such as the upper portion 201 and the lower portion 202, wherein the upper portion 201 is decoupled and unlocked in relation to the lower portion 202 at the forward section FWD and coupled at the aft section AFT, in accordance with an embodiment of the present disclosure. At least one coupling feature, such as an aft coupling feature 249 and a forward coupling feature 250, is configured to couple, lock, unlock, and decouple at least one portion of the plurality of portions, such as an upper portion 201 and a lower portion 202, in relation to another at least one portion of the plurality of portions. The upper portion 201 is configured to interchange with at least one module (not shown). The workflow further comprises lowering the upper portion 201 to the lower portion 202, e.g., by using the handle 266, e.g., in a direction 190.

Figure 20:
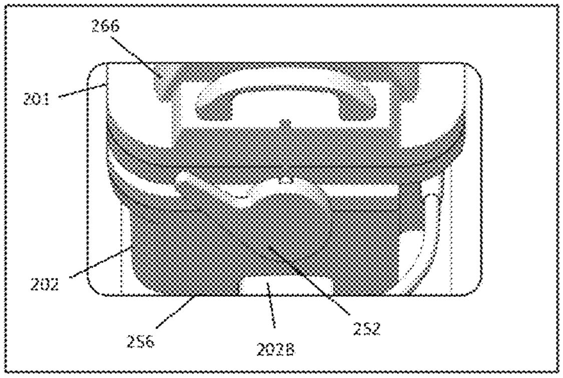
FIG. 20 is a diagram illustrating a cutaway top perspective view of the forward coupling feature, as shown in FIG. 16, the forward coupling feature coupled and unlocked, in accordance with an embodiment of the present disclosure.

Referring to FIG. 20, this diagram illustrates, in a cutaway top perspective view, the coupling feature 250 of a head coil system S (aft section), as shown in FIG. 16, wherein the coupling feature 250 is in a coupled and unlocked position, in accordance with an embodiment of the present disclosure. The coupling feature 250 is configured to operably couple the upper portion 201 with the lower portion 202, e.g., at a forward section FWD, for example. The coupling feature 250 comprises a registration feature 251 and a locking feature 252. The registration feature 251 comprises abase plate 253, a plurality of connectors 254 coupled with the base plate 253, and a post 255 coupled with the base plate 253. The plurality of connectors 254 and the post 255 are configured to couple with complementary features of the upper portion 201. The locking feature 252 comprises a lever 256 for facilitating manual locking and a notch 257 configured to engage and couple with a post 265 of the upper portion 201. By rotating the lever 256, e.g., in a clockwise direction, the post 265 engages and is urged into a channel 258 (FIG. 7F). The workflow further comprises engaging the post 265 of the upper portion 201 with the notch 257 of the lower portion 202, e.g., by further using the handle 266.

Figure 21:
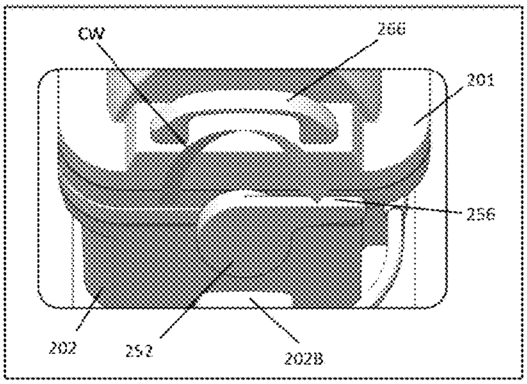
FIG. 21 is a diagram illustrating a cutaway top perspective view of the forward coupling feature, as shown in FIG. 16, the coupling feature coupled and locked, in accordance with an embodiment of the present disclosure.

Referring to FIG. 21, this diagram illustrates, this diagram illustrates, in a cutaway top perspective view, the coupling feature 250 of a head coil system S (aft section), as shown in FIG. 16, wherein the coupling feature 250 is in a coupled and locked position, in accordance with an embodiment of the present disclosure. By rotating the lever 256, e.g., in a clockwise direction CW, the post 265 engages and is urged into a channel 258 (FIG. 7F). By fully rotating the lever 256, e.g., in a clockwise direction to an end of its travel, the post 265 becomes fully engaged in the channel 258, thereby securing and locking the upper portion 201 in relation to the lower portion 202. To confirm registration, coupling, and locking of the upper portion 201 in relation to the lower portion 202, e.g., without any gap therebetween, the system S further comprises at least one indicator (not shown) for providing an indication for registration, such as an LED, in communication with the Rx chain for providing a visual indication, an audio feature, e.g., a beeping feature, and a haptic feature for providing a feeling, e.g., a click, configured to activate when the lever 256 reaches the end of its travel. The workflow further comprises rotating the lever 256, e.g., in a clockwise direction CW to an end of its travel, whereby the post 265 becomes fully engaged in the channel 258, and thereby securing and locking the upper portion 201 in relation to the lower portion 202; and confirming registration, coupling, and locking by at least one indicator.

Referring to FIG. 22, this diagram illustrates, this diagram illustrates, in a perspective view, a viewing accessory 203 of a head coil system S (aft section), as shown in FIG. 16, wherein the coupling feature 250 is in a coupled and locked position, in accordance with an embodiment of the present disclosure. The system S further comprises a viewing accessory 203 configured to facilitate viewing of an environment outside an MRI machine A. The viewing accessory 203 comprises a mirror 203*b*, for example, as shown in FIG. 3. The viewing accessory 203 comprises a mounting feature 203*a* configured to couple the viewing accessory 203 with the upper frame 201*f*. For example, the upper frame 201*f* comprises at least one rail 220; and the mounting feature 203*a* comprises at least one complementary guide (not shown), wherein the at least one guide is configured to engage the at least one rail 220. The workflow further comprises positioning the viewing accessory 203 in relation to the upper frame 201*f*, e.g., in a direction Z, for aligning eyes E of the patient P, coupling the viewing accessory 203 with the upper frame 201*f*, such as by at least one of sliding the at least one guide of the mounting feature 203*a* onto the at least one rail 220 of the upper frame 201*f* and clipping the at least one guide of the mounting feature 203*a* onto the at least one rail 220 of the upper frame 201*f*.

Referring to FIG. 22, this diagram illustrates, in a perspective view, a head coil system S, comprising the viewing accessory 203, as shown in FIG. 22, in accordance with an embodiment of the present disclosure. The workflow further comprises adjusting a position of the viewing accessory 203 in relation to the eyes E of the patient P, e.g., by further sliding the at least one guide of the mounting feature 203*a* along the at least one rail 220 of the upper frame 201*f*, and confirming an optimal position of at least one of the system S and the viewing accessory 203.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become apparent to those skilled in the art, and is to be limited, accordingly, by nothing other than the appended claims, wherein any reference to an element being made in the singular is not intended to mean “one and only one” unless explicitly so stated, but rather “one or more.” All structural and functional equivalents as well as any and all combinations and permutations of the elements and features of the above-described preferred embodiment and additional embodiments as regarded by those of ordinary skill in the art are hereby expressly incorporated by reference and are intended to be encompassed by the present claims.

Moreover, no requirement exists for a system or method to address each, and every, problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, workpiece, and fabrication material detail may be made, without departing from the spirit and scope of the present disclosure, as set forth in the appended claims, as may be apparent to those of ordinary skill in the art, are also encompassed by the present disclosure.

What is claimed:

1. A head coil system, comprising:

a lower portion comprising a lower frame and a lower magnetically conductive receiver coil, the lower portion configured to accommodate a head of a patient on a resting surface;

an upper portion comprising an upper frame and an upper magnetically conductive receiver coil, the upper frame comprising a V-shaped configuration configured to accommodate a nose of a patient and comprising at least one eye-hole;

at least one coupling feature configured to at least one of couple, lock, unlock, and decouple at least one portion of the plurality of portions in relation to another at least one portion of the plurality of portions, the at least one coupling feature comprising a forward coupling feature and an aft coupling feature;

a forward coupling feature configured to couple the upper portion to the lower portion at a forward section, the forward coupling feature comprising: (i) a registration feature including a base plate, a plurality of connectors coupled with the base plate, and a post coupled with the base plate; and (ii) a locking feature including a lever and a notch configured to engage the post and to urge the post into a channel upon rotation of the lever, thereby locking the upper portion relative to the lower portion;

an aft coupling feature configured to register the upper portion with the lower portion at an aft section, the aft coupling feature comprising complementary upper registration features and lower registration features configured to rotate relative to one another;

a tilting feature configured to dispose at least one portion of the plurality of portions of the lower portion and the head coil system at an angle in relation to a horizontal plane; and a viewing accessory configured to facilitate viewing of an environment outside an MRI machine, a viewing accessory configured to facilitate viewing of an environment outside an MRI machine, the viewing accessory being slidably coupled to at least one rail of the upper frame for positional adjustment relative to eyes of the patient.

2. The system of claim 1, wherein the tilting feature is configured to couple, lock, unlock, and decouple the at least one portion of the plurality of portions lower portion in relation to a bed of a medical transporter.

3. The system of claim 1, wherein the angle comprises a range of approximately 0 degrees to approximately 10 degrees.

4. The system of claim 1, wherein the tilting feature comprises a wedge configuration.

5. The system of claim 1, wherein the tilting feature aft coupling feature comprises a trough configuration complementing that of the a bed medical transporter, and wherein the aft coupling feature is configured to permit relative rotation of the upper portion and the lower portion to accommodate the angle provided by the tilting feature.

6. The system of claim 1, further comprising a viewing accessory configured to facilitate viewing of an environment outside an MRI machine.

7. The system of claim 6, wherein the viewing accessory comprises a mirror.

8. The system of claim 1, wherein the magnetically conductive receiver coil lower magnetically conductive receiver coil and the upper magnetically conductive receiver coil each comprises at least one of copper and a copper tube.

9. The system of claim 8, wherein the magnetically conductive receiver coil provides high performance in relation to an MRI machine having a low magnetic field, and wherein the low magnetic field is approximately 0.5 Tesla, the copper tube comprises a diameter of approximately 7/16 inch, and wherein the lower magnetically conductive receiver coil and the upper magnetically conductive receiver coil are each configured for use with an MRI machine having a magnetic field of approximately 0.5 Tesla.

10. A method of fabricating a head coil system, comprising:

providing a lower portion comprising a lower frame and a lower magnetically conductive receiver coil configured to accommodate a head of a patient on a resting surface;

providing an upper portion comprising an upper frame and an upper magnetically conductive receiver coil, the upper frame comprising a V-shaped configuration and at least one eye-hole;

providing at least one coupling feature configured to at least one of couple, lock, unlock, and decouple the upper portion and the lower portion, the at least one coupling feature comprising a forward coupling feature and an aft coupling feature;

providing a forward coupling feature configured to couple the upper portion to the lower portion at a forward section, the forward coupling feature comprising a registration feature including a base plate, a plurality of connectors coupled with the base plate, and a post coupled with the base plate, and a locking feature including a lever and a notch configured to engage the post and to urge the post into a channel upon rotation of the lever;

providing an aft coupling feature configured to register the upper portion with the lower portion at an aft section, the aft coupling feature comprising complementary upper and lower registration features configured to rotate relative to one another;

providing a tilting feature configured to dispose at least one portion of the plurality of portions of the lower portion and the head coil system at an angle in relation to a horizontal plane; and providing a viewing accessory configured to facilitate viewing of an environment outside an MRI machine, providing a viewing accessory slidably couplable to at least one rail of the upper frame for positional adjustment relative to eyes of a patient.

11. The method of claim 10, wherein the plurality of portions comprises an upper portion and a lower portion; wherein at least one of the upper portion is configured to operably couple with the lower portion and the lower portion is configured to operably couple with the upper portion; and wherein the upper portion is configured to interchange with at least one module, wherein the at least one module comprises at least one of a two-loop module and a horseshoe module, wherein providing the upper portion comprises providing the upper frame with a V-shaped configuration and at least one eye-hole configured to accommodate the nose and eyes of a patient.

12. The method of claim 10, wherein providing the tilting feature comprises configuring the tilting feature to couple, lock, unlock, and decouple the at least one portion of the plurality of portions lower portion in relation to a bed of a medical transporter.

13. The method of claim 10, wherein the angle comprises a range of approximately 0 degrees to approximately 10 degrees.

14. The method of claim 10, wherein providing the tilting feature comprises providing the tilting feature with a wedge configuration.

15. The method of claim 10, wherein providing the tilting feature aft coupling feature comprises providing the tilting feature with a trough configuration complementing that of a bed of a medical transporter, providing complementary upper and lower registration features configured to rotate relative to one another to accommodate the angle provided by the tilting feature.

16. The method of claim 10, further comprising providing a viewing accessory configured to facilitate viewing of an environment outside an MRI machine.

17. The method of claim 10, wherein providing the each magnetically conductive receiver coil comprises providing at least one of copper and a copper tube having a diameter of approximately 7/16 inch configured for use with an MRI machine having a magnetic field of approximately 0.5 Tesla.

18. A method of using a head coil system, comprising:

disposing the head coil system in relation to a bed of a medical transporter using a tilting feature;

disposing a head of a patient on a resting surface of a lower portion of the head coil system;

lowering an upper portion relative to the lower portion;

registering the upper portion with the lower portion at an aft section by engaging complementary upper and lower registration features of an aft coupling feature configured to rotate relative to one another;

engaging a post of the upper portion with a notch of a forward coupling feature at a forward section;

rotating a lever of the forward coupling feature to urge the post into a channel and thereby lock the upper portion relative to the lower portion; and adjusting a viewing accessory by sliding the viewing accessory along at least one rail of the upper portion to a position relative to eyes of the patient.

* * * * *